US008778780B1

(12) United States Patent
Doan et al.

(10) Patent No.: US 8,778,780 B1
(45) Date of Patent: Jul. 15, 2014

(54) METHOD FOR DEFINING SEMICONDUCTOR DEVICES

(75) Inventors: Trung-Tri Doan, Baoshan Township (TW); Chen-Fu Chu, Hsinchu (TW); Hao-Chun Cheng, Donggang Township (TW); Feng-Hsu Fan, Jhonghe (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 942 days.

(21) Appl. No.: 11/548,633

(22) Filed: Oct. 11, 2006

Related U.S. Application Data

(60) Provisional application No. 60/726,748, filed on Oct. 13, 2005.

(51) Int. Cl.
*H01L 21/00* (2006.01)

(52) U.S. Cl.
USPC ............ 438/463; 438/33; 438/68; 438/113; 257/14; 257/79; 257/94; 257/E21.347; 257/E21.599

(58) Field of Classification Search
USPC ............ 438/22, 26, 33, 34, 42, 460, 463, 68, 438/113, 462; 257/14, 79, E21.347, 257/E21.599
See application file for complete search history.

(56) References Cited

U.S. PATENT DOCUMENTS

| | | | | |
|---|---|---|---|---|
| 4,904,610 A | * | 2/1990 | Shyr | 438/463 |
| 5,024,970 A | * | 6/1991 | Mori | 438/462 |
| 6,291,316 B1 | * | 9/2001 | Knowles et al. | 438/462 |
| 6,838,299 B2 | * | 1/2005 | Mulligan et al. | 438/33 |
| 6,974,726 B2 | * | 12/2005 | Dani et al. | 438/114 |
| 7,149,233 B2 | * | 12/2006 | Furukawa et al. | 372/49.01 |
| 7,186,580 B2 | * | 3/2007 | Tran et al. | 438/22 |
| 7,239,337 B2 | * | 7/2007 | Ogihara et al. | 347/238 |
| 7,723,718 B1 | * | 5/2010 | Doan et al. | 257/14 |
| 2002/0127824 A1 | * | 9/2002 | Shelton et al. | 438/463 |
| 2003/0234244 A1 | * | 12/2003 | McCoy | 219/121.72 |
| 2004/0235210 A1 | * | 11/2004 | Tamura et al. | 438/22 |
| 2004/0248377 A1 | * | 12/2004 | Yoo et al. | 438/458 |
| 2005/0035099 A1 | * | 2/2005 | Nakamura et al. | 219/121.72 |
| 2005/0035100 A1 | * | 2/2005 | Genda | 219/121.72 |
| 2005/0139962 A1 | * | 6/2005 | Dani et al. | 257/620 |
| 2005/0242365 A1 | * | 11/2005 | Yoo | 257/103 |
| 2006/0189098 A1 | * | 8/2006 | Edmond | 438/460 |
| 2006/0244001 A1 | * | 11/2006 | Lee et al. | 257/103 |
| 2007/0173036 A1 | * | 7/2007 | Kusunoki | 438/465 |
| 2008/0070380 A1 | * | 3/2008 | Kusunoki | 438/462 |

OTHER PUBLICATIONS

S.M. Sze, Semiconductor Devices Physics and Technology, 2nd Edition, pp. 428-429.*

* cited by examiner

*Primary Examiner* — Su Kim
(74) *Attorney, Agent, or Firm* — Stephen A. Gratton

(57) ABSTRACT

Techniques for fabricating metal devices, such as vertical light-emitting diode (VLED) devices, power devices, laser diodes, and vertical cavity surface emitting laser devices, are provided. Devices produced accordingly may benefit from greater yields and enhanced performance over conventional metal devices, such as higher brightness of the light-emitting diode and increased thermal conductivity. Moreover, the invention discloses techniques in the fabrication arts that are applicable to GaN-based electronic devices in cases where there is a high heat dissipation rate of the metal devices that have an original non- (or low) thermally conductive and/or non- (or low) electrically conductive carrier substrate that has been removed.

24 Claims, 24 Drawing Sheets

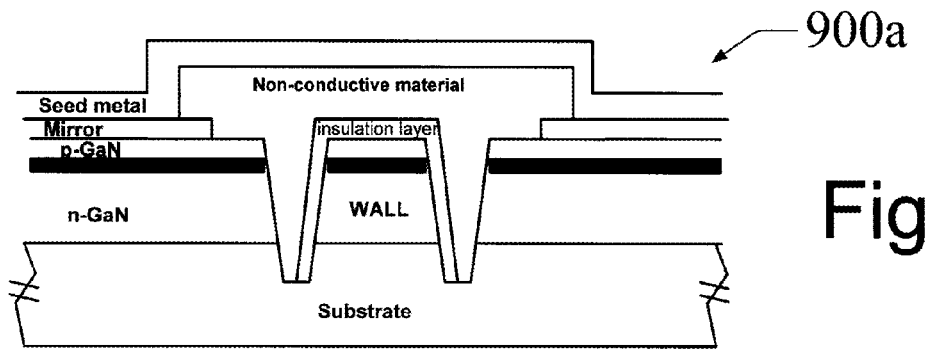
Fig. 9a
Fig. 9b
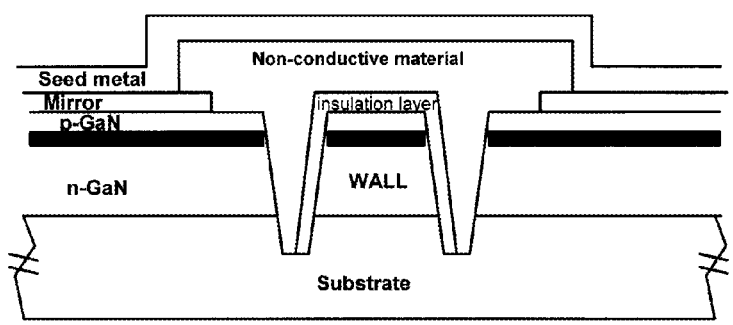
Fig. 9c
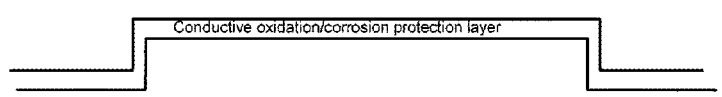

1100

1500 ⟶

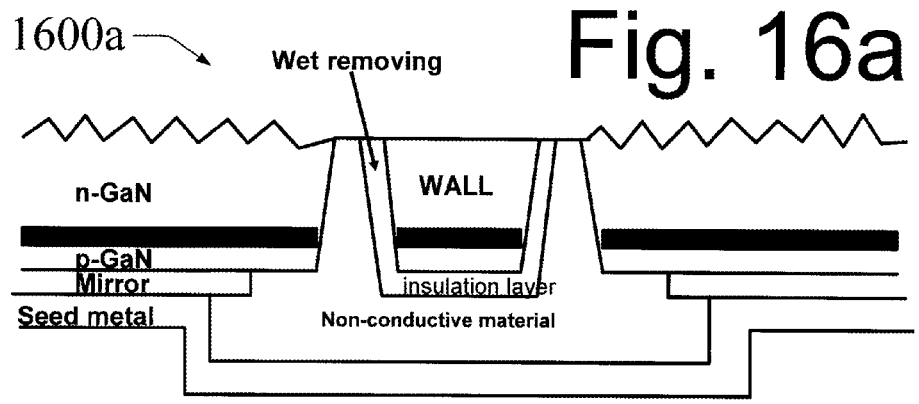
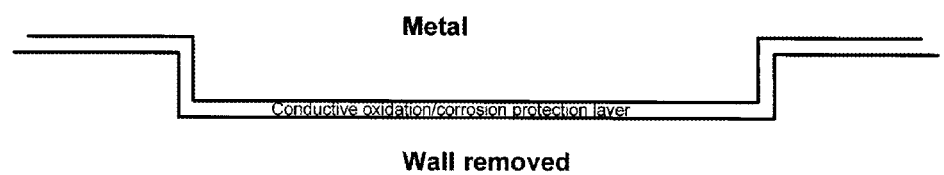
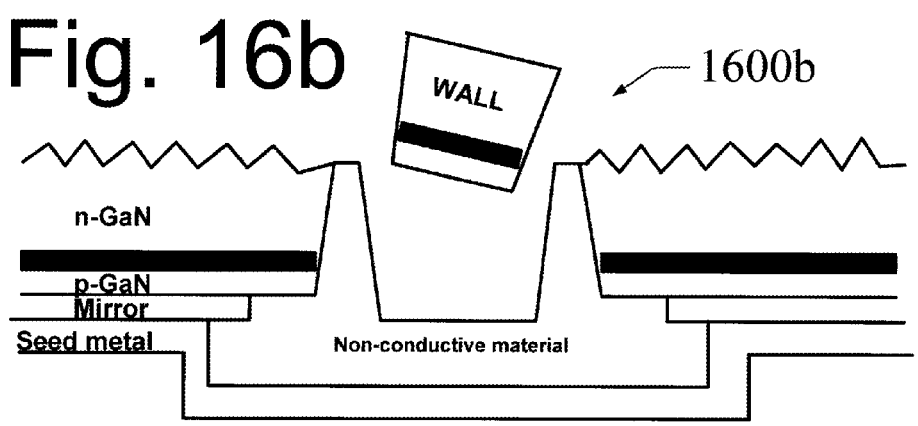
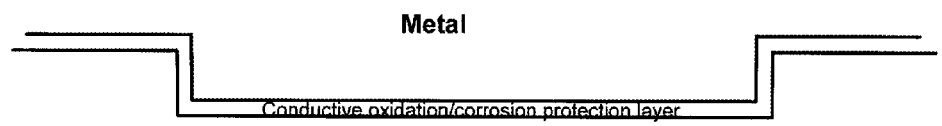

1700a

1700b

Laser interaction region

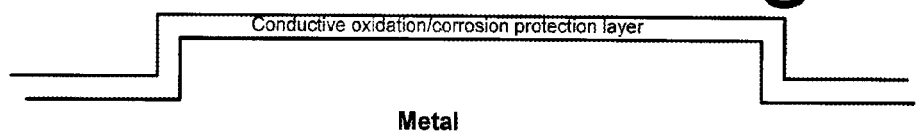
Fig. 18a
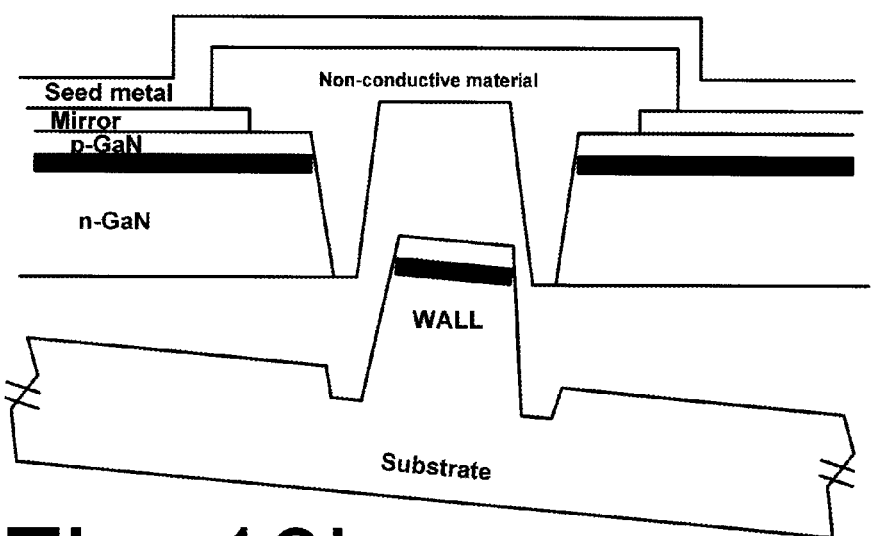
Fig. 18b
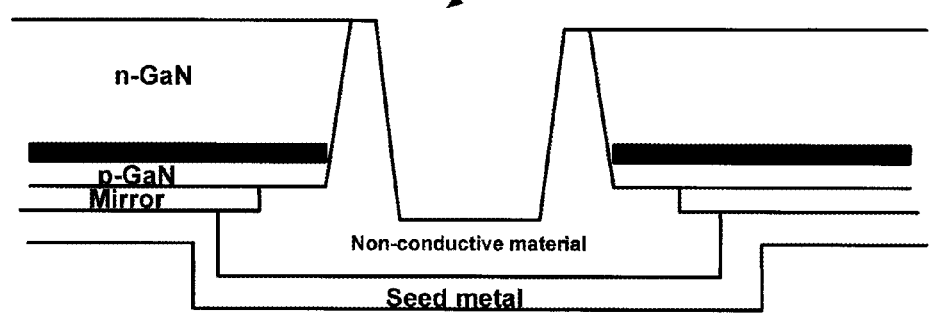

Laser Cut through Metal

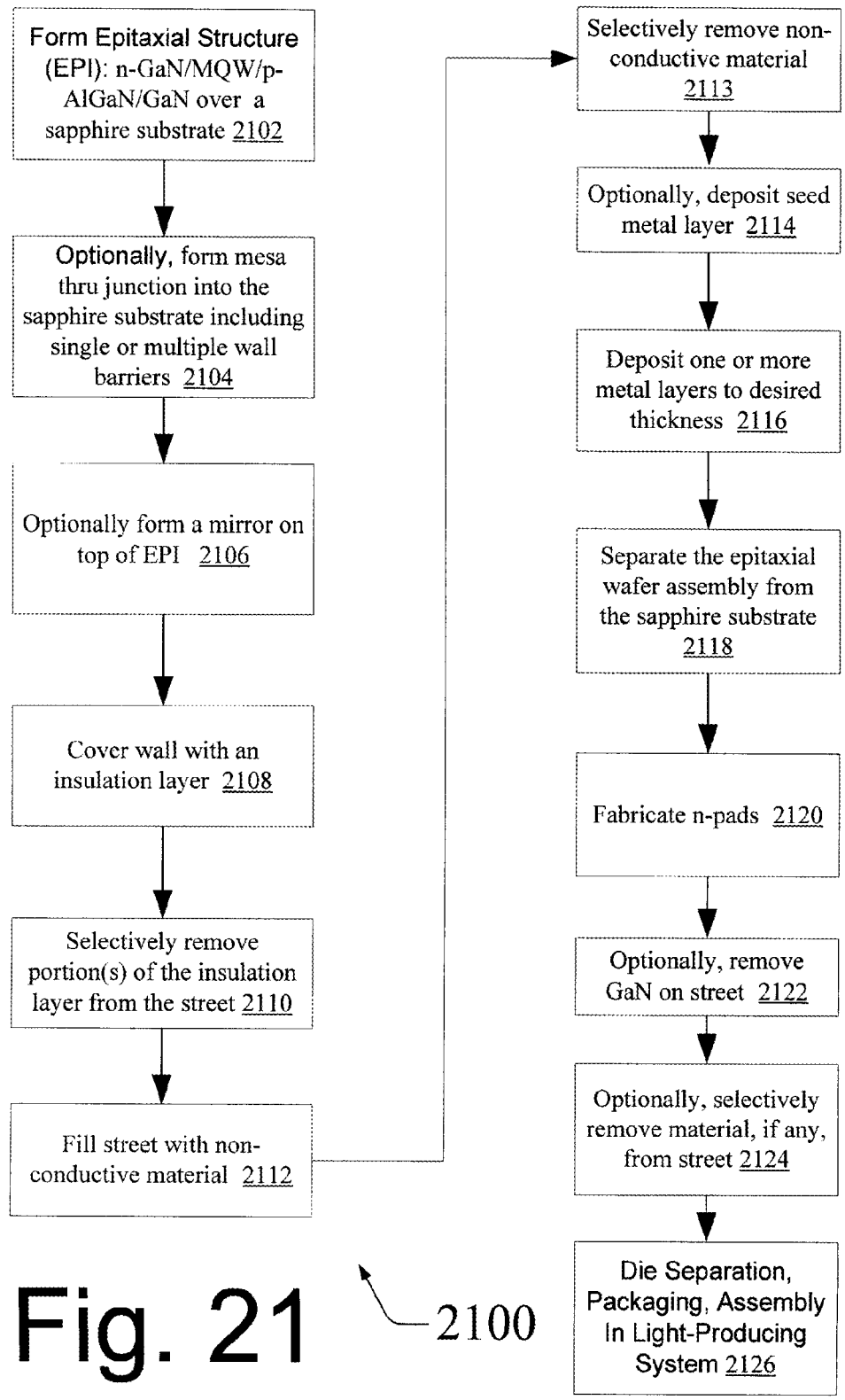
Fig. 21    2100

METHOD FOR DEFINING SEMICONDUCTOR DEVICES

CROSS-REFERENCE TO RELATED APPLICATION

This application claims benefit of U.S. provisional patent application Ser. No. 60/726,748, filed on Oct. 13, 2005, which is herein incorporated by reference.

TECHNICAL FIELD

Embodiments of the present invention generally relate to a metal device, such as a light emitting diode (LED), a power device, a laser diode, and a vertical cavity surface emitting device, and methods for fabricating the same.

BACKGROUND

Microelectronic devices, such as metal devices, are playing an increasingly important role in our daily life. For instance, LEDs have become ubiquitous in many applications, such as mobile phones, appliances, and other electronic devices. Recently, the demand for nitride-based semiconductor materials (e.g., having gallium nitride or GaN) for opto-electronics has increased dramatically for applications ranging from video displays and optical storage to lighting and medical instruments.

Conventional blue LEDs are formed using compound semiconductor materials with nitride, such as GaN, AlGaN, InGaN, and AlInGaN. Most of the semiconductor layers of these light-emitting devices are epitaxially formed on electrically non-conductive sapphire substrates.

SUMMARY OF THE INVENTION

One embodiment of the invention is a method. The method generally includes providing a wafer assembly comprising multiple semiconductor layers deposited on a substrate and applying a laser to cut through at least the deposited layers without cutting completely through the substrate and define one or more semiconductor devices in the wafer assembly.

Another embodiment of the invention is a method. The method generally includes providing a wafer assembly comprising an n-doped layer deposited on a substrate, a multiple quantum well (MQW) layer disposed above the n-doped layer, and a p-doped layer disposed above the MQW layer; and cutting through at least the n-doped, the MQW, and the p-doped layers with a laser without cutting completely through the substrate to define one or more vertical light-emitting diode (VLED) devices in the wafer assembly.

Yet another embodiment of the invention is a method. The method generally includes providing a wafer assembly comprising an n-doped layer deposited on a substrate, a multiple quantum well (MQW) layer disposed above the n-doped layer, and a p-doped layer disposed above the MQW layer; and cutting through at least the p-doped and the MQW layers with a laser without cutting completely through the n-doped layer to define one or more devices in the wafer assembly.

BRIEF DESCRIPTION OF THE DRAWINGS

FIGS. 9a-c illustrate depositing a seed metal, one or more additional metal layers, and a conductive protection layer in accordance with embodiments of the invention.

FIGS. 16a-b illustrate removing a wall structure after removal of the carrier substrate from the wafer assembly in accordance with embodiments of the invention.

FIGS. 18a-b illustrate removing the carrier substrate from the wafer assembly after application of the laser pulse in FIGS. 17a-b in accordance with embodiments of the invention.

FIG. 21 is a flowchart of a method for fabricating vertical light-emitting diode (VLED) devices in accordance with an embodiment of the invention.

DETAILED DESCRIPTION

Embodiments of the invention provide improvements in the art of light-emitting diodes (LEDs) and methods of fabrication, including higher yield and better performance such as higher brightness of the LED and better thermal conductivity. Moreover, the invention discloses improvements in the fabrication arts that are applicable to GaN based electronic devices such as power devices, laser diodes, and vertical cavity surface emitting laser devices in cases where there is a high heat dissipation rate of the metal devices that have an original non- (or low) thermally conductivity and/or non- (or low) electrically conductive substrate that has been removed.

Implementations provide for a metal device, such as a vertical light-emitting diode (VLED), a power device, a laser diode, and a vertical cavity surface emitting device, and methods for fabricating the same.

Figure 1A:
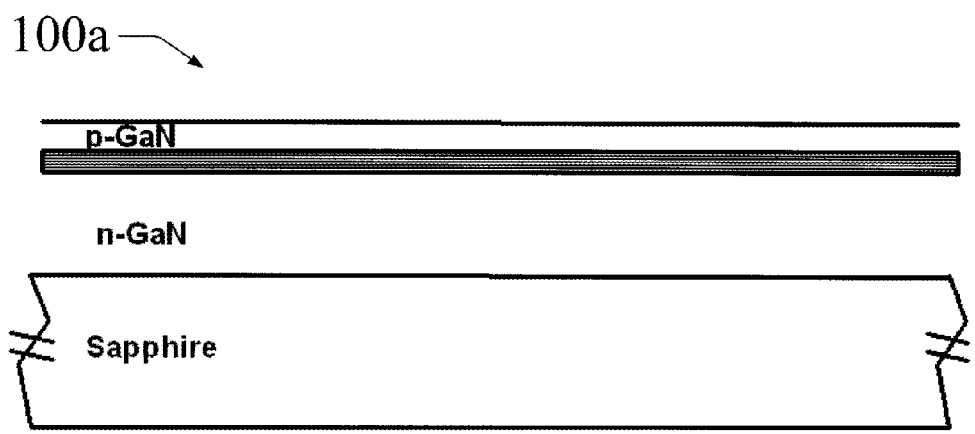
FIG. 1a is a cross-sectional schematic representation of a wafer illustrating the layers of an epitaxial structure deposited on a carrier substrate in accordance with an embodiment of the invention.
Figure 1B:
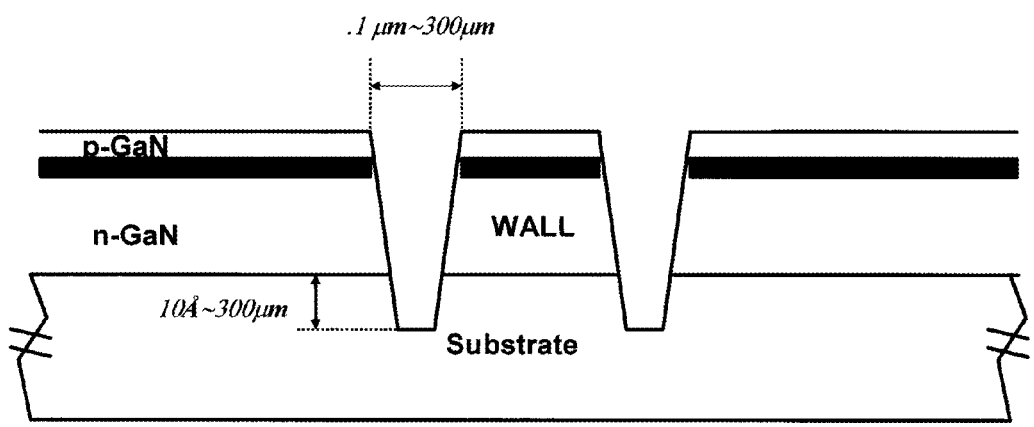
FIG. 1b illustrates the dimensions of a trench after the metal devices and a wall structure have been defined in the wafer of FIG. 1a in accordance with an embodiment of the invention.

Referring to FIG. 1a, a wafer 100a may comprise a carrier substrate. Although the carrier substrate can be composed of sapphire, silicon carbide (SiC), silicon, germanium, zinc oxide (ZnO), or gallium arsenide (GaAs), the examples provided herein will be directed to a carrier substrate that is composed of sapphire. As shown in FIG. 1b at reference numeral 100b, a multi layer epitaxial structure (EPI) may be formed to have an n-type GaN layer, one or more quantum wells with InGaN/GaN layers, and a p-type AlGaN/GaN layer. Although the n-type layer and the p-type layer may comprise various compound semiconductor materials, such as GaN, AlGaN, InGaN, and AlInGaN, n-GaN and p-GaN layers will be described henceforth.

Figure 2A:
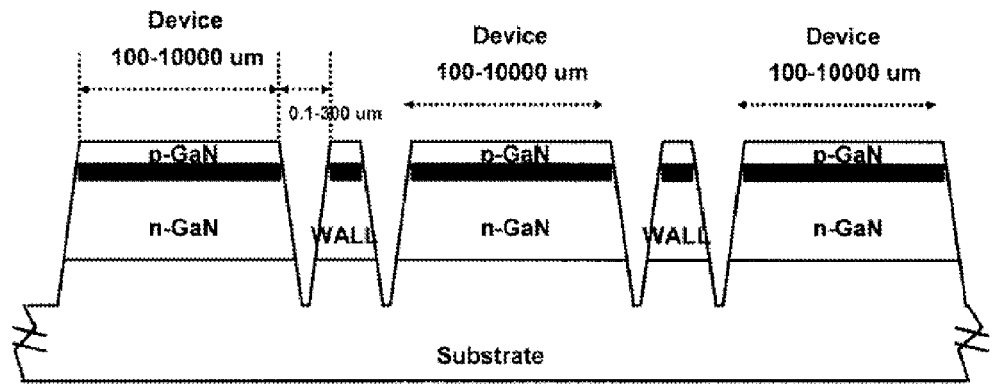
FIGS. 2a-c illustrate creating trenches in the wafer assembly to define devices and one or more wall structures within the street areas between devices in accordance with embodiments of the invention.
Figure 2B:
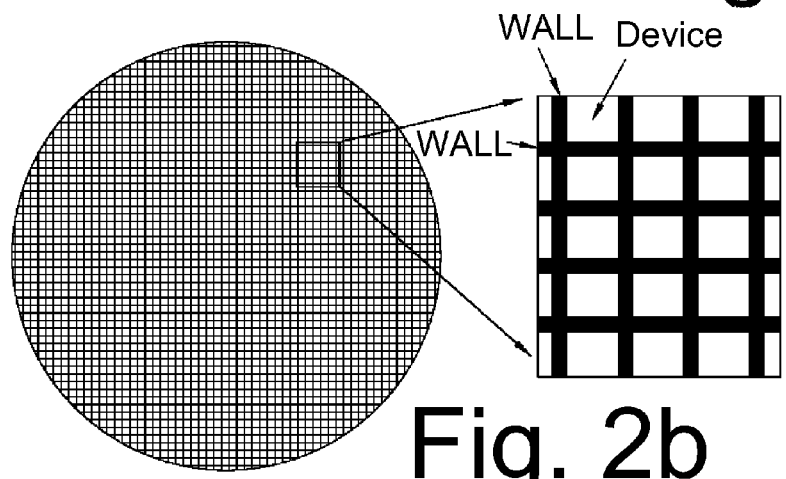
Figure 2C:
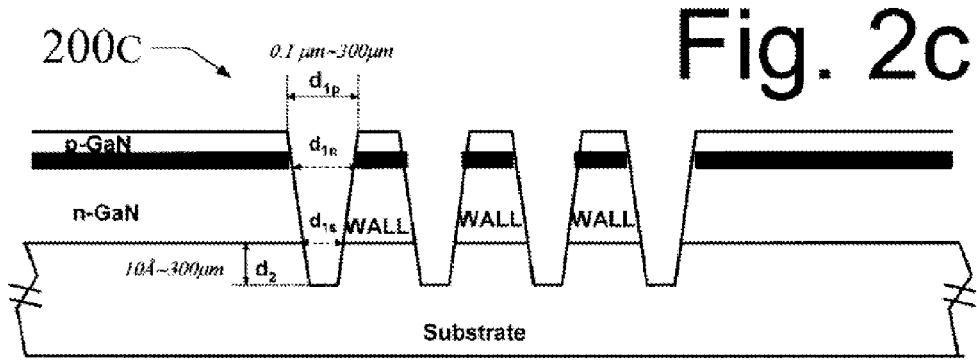

Referring now to FIGS. 2a-2c, various methods may be used to define one or more devices using a process that cuts directly through a p-n junction and potentially into the substrate, as is shown at 200a in FIG. 2a. For some embodiments, the devices may be defined only to the n-GaN layer (i.e., cuts may be made through the p-GaN layer, through the MQW layer, and only partially into the n-GaN layer). These various methods used to define the devices may include a dry etching (inductively coupled plasma reactive ion etching, or ICP/RIE) process, laser cutting, saw cutting, diamond cutting, wet etching, and water jetting. For some embodiments, combinations of two or more of the above methods may be used. For example, laser cutting may be followed by wet etching in an effort to further define the devices and prepare the surface. As another example, dry etching may be employed first and followed by laser cutting. In yet another example, wet etching may be applied first, followed by dry etching and then by laser cutting. As another example, dry etching may be utilized first, followed by wet etching and then by laser cutting. In yet another example, dry etching may be employed first, followed by laser cutting and then by wet etching. There may be many other suitable combinations.

For the case of laser cutting, it may be advantageous to protect the devices with a removable protecting coating (e.g., a polymer coating) before cutting in order to protect the devices from the debris that can be formed during the laser cutting process. It may also be advantageous to cut the devices in an oxygen-containing environment for manufacturing and junction properties.

After the laser cutting process, the devices may be cleaned in a liquid and/or a solvent in an effort to effectively remove the debris, to remove the protective coating if one is used, and to clean/passivate the junction. The liquid may be a base or an acid solution with or without an oxidizer (e.g., $H_2SO_4:H_2O_2$, $HNO_3$, $HNO_3/HCl$, $NH_4OH:H_2O_2$, $KOH:H_2O_2$, $H_3PO_4$). The solutions may be heated or may be used at room temperature. Any solvent may be used to clean the devices in an effort to remove the removable protective coating on the surface of the wafer. The solvent may be used with or without a surfactant and may be a water solution. The solvent may be used first, followed by the liquid. Alternatively, the liquid may be used first, followed by the solvent. For some embodiments, only the liquid may be used to clean the devices, or only the solvent may be used to clean the devices. It may be preferred, however, to remove the protecting coating first with the solvent, and then clean/passivate the junction with the liquid.

Figure 10A:
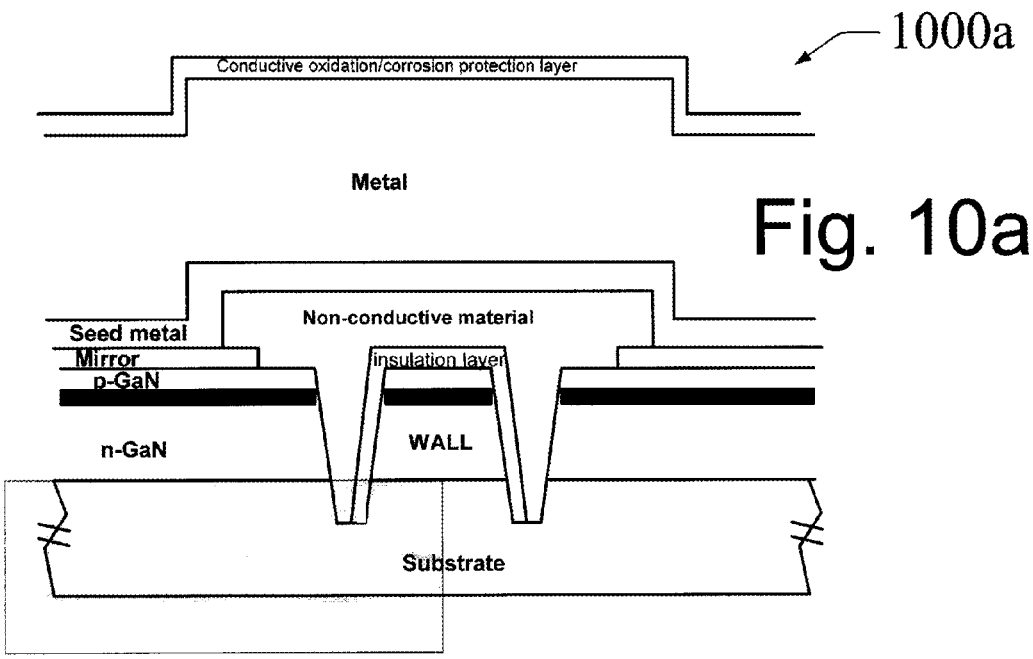
FIGS. 10a-b illustrate removal of the carrier substrate from the wafer assembly in accordance with embodiments of the invention.
Figure 17A:
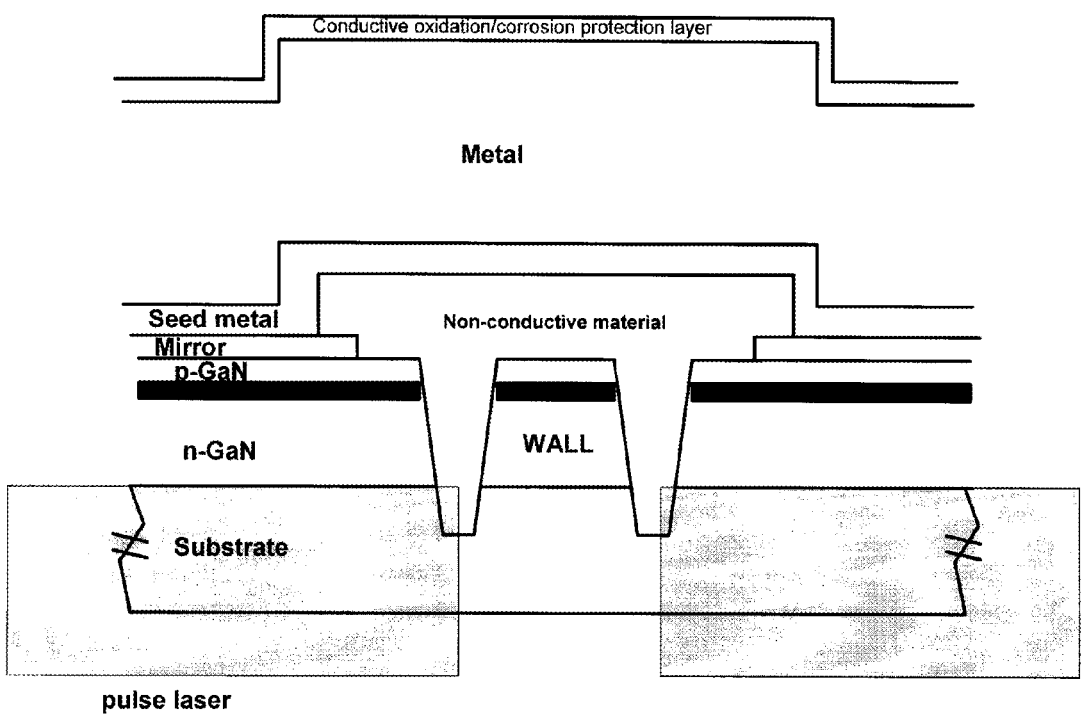
FIGS. 17a-b illustrate applying a laser pulse8 covering only the area of the die without extending into the street areas between the dies in accordance with embodiments of the invention.

In the laser cutting process, a solid state laser may be used at preferably a 266 nm or a 355 nm wavelength. A defined width may be in a range from about 0.1 μm to about 300 μm, where this defined width is seen in FIG. 2c as $d_{1p}$, the defined width between the p-type layer of one device and an adjacent structure. The depth d2 that is removed from the substrate may be in a range from about 10 Å to about 300 μm. Such an opening in the substrate is referred hereinafter as the "substrate trench." It may also be observed in FIG. 2c that the opening of a region in the p-GaN layer may be larger than the opening of a region at the interface of n-GaN and the substrate, where $d_{1p}$ is greater than $d_{1n}$, the defined width between the n-type layer and an adjacent structure which is greater than $d_{1s}$, the defined width of the substrate trench. During the laser cutting process, the surface of the substrate trench may be changed. Because of this change, during the separation of the devices from the substrate using laser irradiation upon the back side of the substrate, opposite the device side of the substrate, as shown in FIGS. 10a and 17a, the laser energy may be reduced/disrupted to minimize the damage to the devices. It may also be advantageous to have the substrate trench in an effort to reduce/disrupt the laser energy that might potentially damage devices during a separation of the devices from the substrate. Likewise, it may be advantageous to form a single wall as seen in FIG. 2a or multiple walls as seen in FIG. 2c so as to form a barrier that may prevent or reduce an interaction force that might potentially damage devices during a separation of the devices from the substrate. FIG. 2b shows a wafer 200b and, in an enlarged view thereof, the devices on the wafer are clearly separated by streets.

Figure 3:
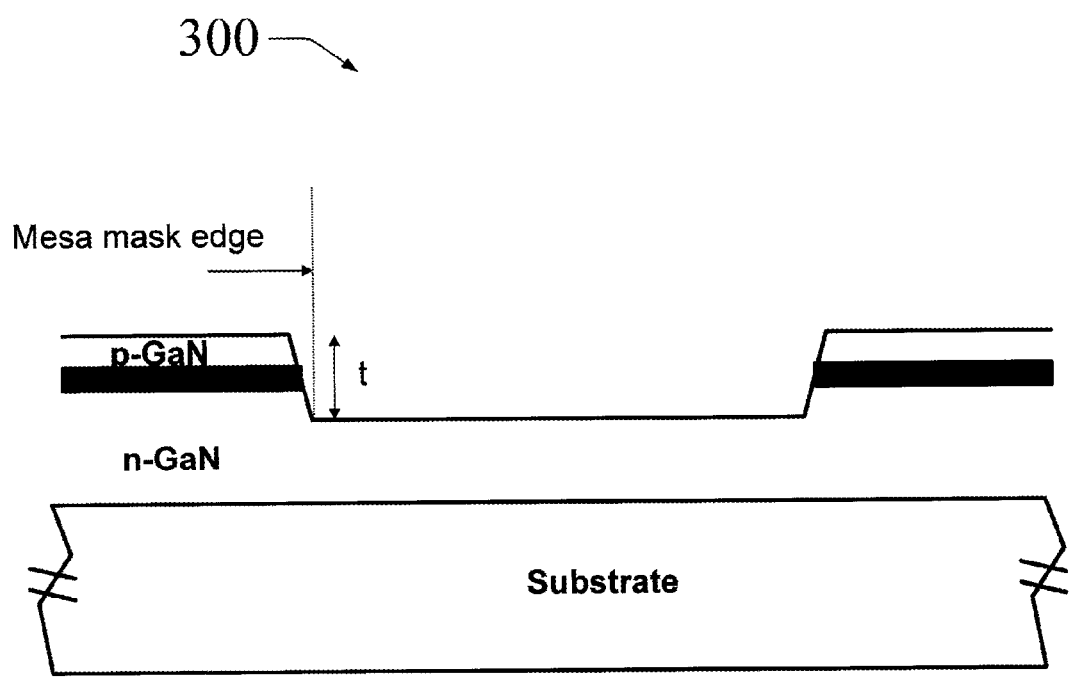
FIG. 3 illustrates defining a mesa in the epitaxial layers in accordance with an embodiment of the invention.

To create one or more walls, as shown for a wafer 300 in FIG. 3, a method may be used to define a mesa area. For some embodiments, a photo masking process may be used to define the mesa, and then dry or wet etching (dry is preferred) may be utilized to etch through the multiple quantum well (MQW) layer, stopping within the n-GaN layer. As shown in FIG. 3, a thickness 't' extends from the surface of the p-GaN, past the MQW and into the n-GaN. The thickness 't', which may be about 1 μm, may be greater than or equal to the thickness of the p-GaN layer plus the thickness of the MQW layer.

Figure 4A:
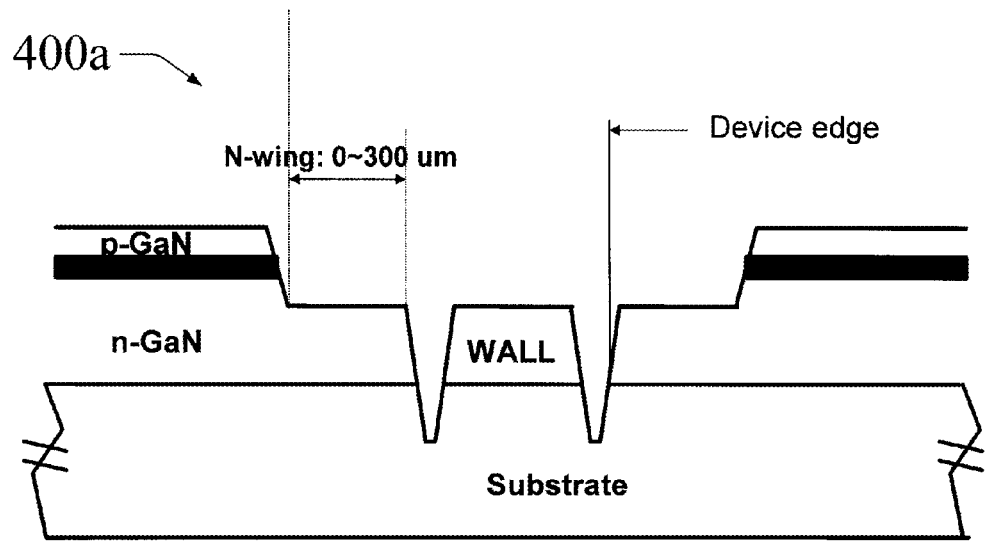
FIGS. 4a-b illustrate defining one or more wall structures within the mesa of FIG. 3 in accordance with embodiments of the invention.
Figure 4B:
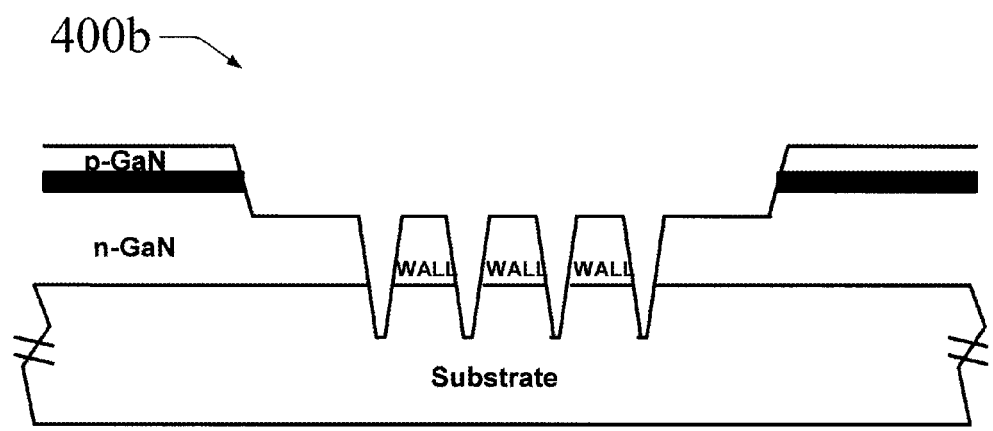
Figure 5A:
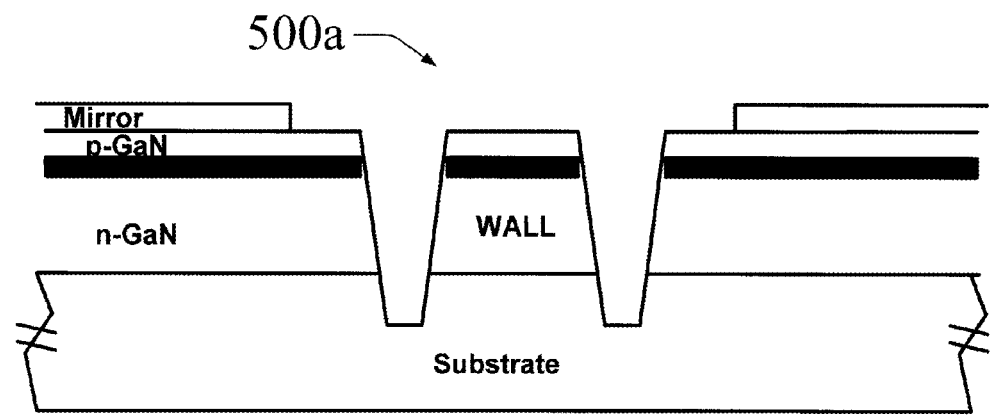
FIGS. 5a-b illustrate adding a mirror to the epitaxial structure of FIG. 1b and an optional insulative layer to the wall structure in accordance with embodiments of the invention.
Figure 5B:
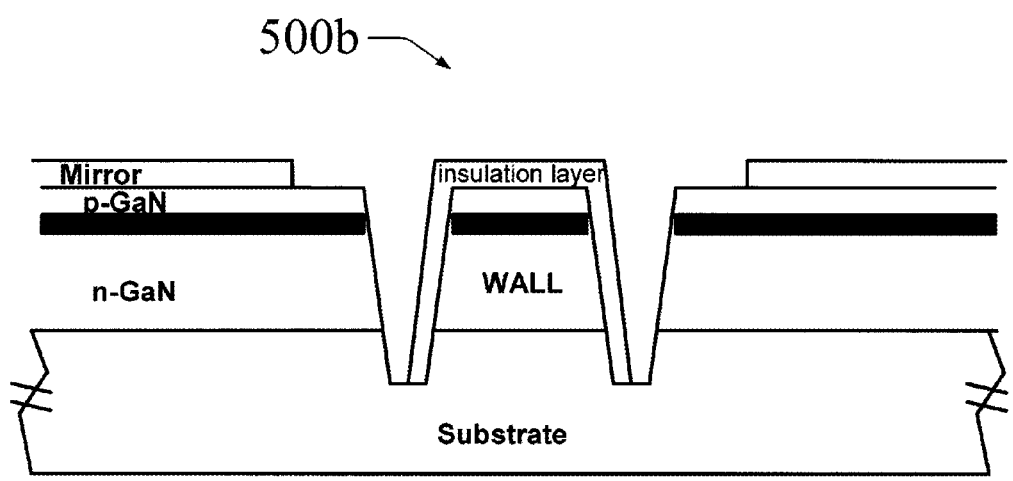

For other embodiments, as seen for the wafers 400a and 400b in FIGS. 4a and 4b, respectively, the devices may be defined into the substrate by using a process such as dry etching (ICP/RIE), laser cutting, saw cutting, wet etching, or water jetting. After the mesa is etched to define the junctions, the devices may be defined/separated with a wall or walls using a process such as dry etching (ICP/RIE), laser cutting, saw cutting, wet etching, or water jetting. FIG. 4a shows the option of fabricating a single wall with an N-wing structure that can have a flat dimension up to about 300 μm. FIG. 4b depicts the option of fabricating multiple walls with an N-wing structure that can have a flat dimension up to about 300 μm. For the case of laser cutting, it may be advantageous to protect the devices with a removable protecting coating (e.g., a polymer coating) before cutting in an effort to protect the devices from the debris that can be formed during the laser cutting process. It may also be advantageous to cut the devices in an oxygen-containing environment for manufacturing and junction properties.

After the laser cutting process, the devices may be cleaned in a liquid and/or a solvent to effectively remove the debris, to remove the protective coating if one is used, and to clean/passivate the junction. The liquid may be a solution containing a base or an acid with or without an oxidizer (e.g., H2SO4: H2O2, HNO3, HNO3/HCl, NH4OH:H2O2, KOH:H2O2, H3PO4). The solution may be heated or may be used at room temperature. Any solvent may be used to clean the devices in an effort to remove the removable protective coating on the surface of the wafer. The solvent may be used with or without a surfactant and may be a water solution. The solvent may be used first, followed by the liquid. Alternatively, the liquid may be used first, followed by the solvent. For some embodiments, only the liquid is used to clean the devices, while in others, only the solvent is used to clean the devices. It may be preferred, however, to remove the protecting coating first, and then clean/passivate the junction with the liquid.

After an epitaxial wafer assembly is fabricated upon the substrate, a laser operation may be used to separate the substrate from the epitaxial wafer assembly. Various implementations of an epitaxial wafer assembly that have been fabricated upon a substrate followed by the separation of the epitaxial wafer assembly from its substrate are shown in FIGS. 10a-10b, 16a-16b, and 18a-18b. The laser operation may produce a wave that has enough force to cause damage to adjacent devices when the epitaxial wafer assembly is separated from the substrate. The wall(s) as described herein may assist in reducing or preventing damage to the adjacent devices when the epitaxial wafer assembly is separated from the substrate. As such, the wall(s) may advantageously serve as damage prevention barriers. As noted above, regarding FIGS. 2a-2b, it may be advantageous to form a single wall as seen in FIG. 4a or multiple walls as seen in FIG. 4b in an effort to form such damage prevention barriers.

Referring now to FIGS. 5a-5b, 6a-6d, and 23a-23c, a mirror may be formed on top of the p-GaN to act as the reflector for photons. The mirror, by way of example, may be composed of multiple layers, such as Ni/Ag/Ni/Au, Ag/Ni/Au, Ti/Ag/Ni/Au, Ag/Pt or Ag/Pd or Ag/Cr, using an alloy containing Ag, Au, Cr, Pt, Pd, or Al. Optionally, the mirror may be formed after an insulation layer is formed, as shown in FIGS. 5b, 6a-6d, in an effort to protect the junction areas. In such cases, the mirror may be formed after portions of the insulation layer have been removed from unwanted areas. FIGS. 5a-5b, 6a-6d, and 23a-23c show a variety of different ways to form the mirror on the epitaxial wafer assembly.

A high temperature annealing or alloying of the mirror maybe desirable to improve the contact resistance of the mirror to the p-GaN layer and/or its adhesion. The annealing or alloying may be conducted at a temperature of at least 150° C. in an inert environment (e.g., an atmosphere containing little or no oxygen, hydrogen, or neither oxygen nor hydrogen).

Figure 6A:
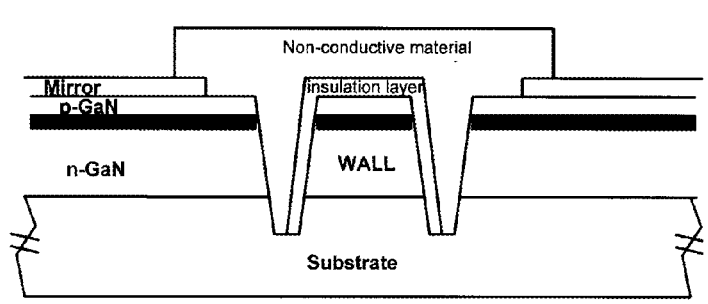
FIGS. 6a-d illustrate adding electrically non-conductive material to the wafer of FIG. 5b in accordance with embodiments of the invention.
Figure 6B:
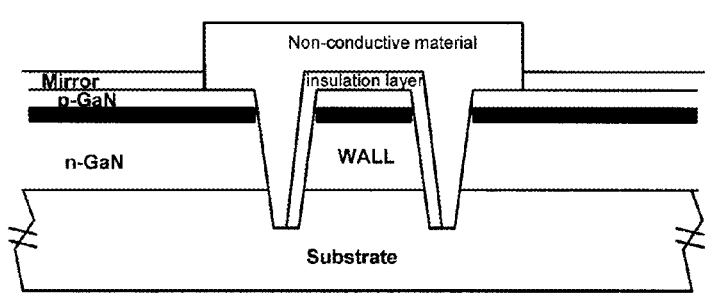
Figure 6C:
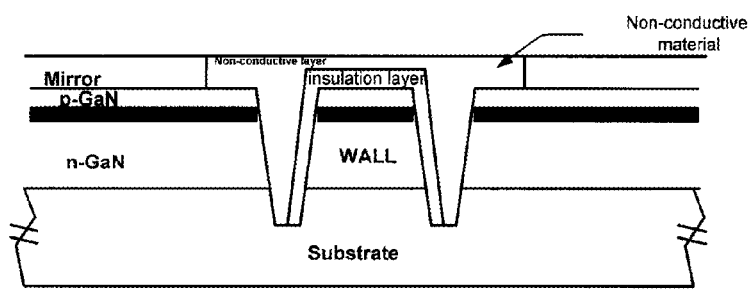
Figure 6D:
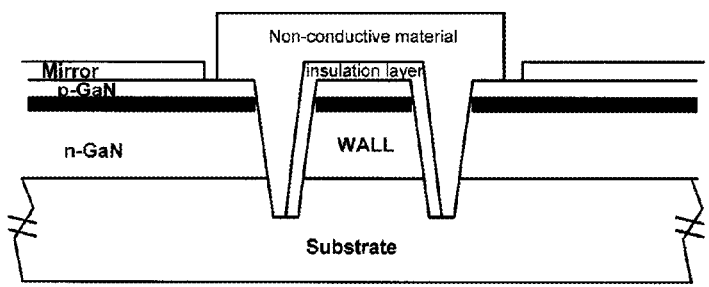
Figure 23A:
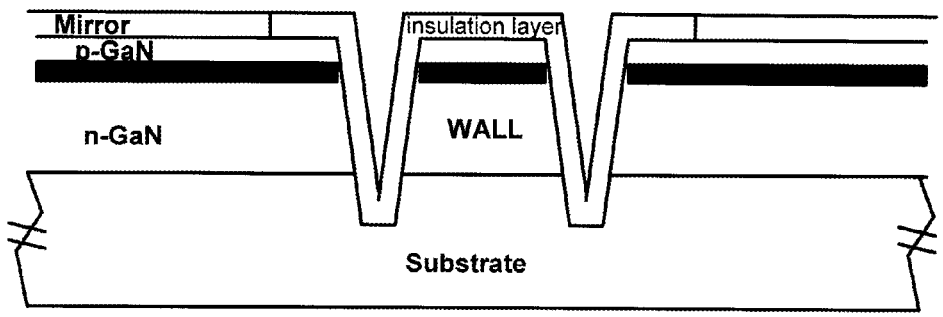
FIGS. 23a-c illustrate options for the mirror, the insulative layer, and the non-conductive material in accordance with embodiments of the invention.
Figure 23B:
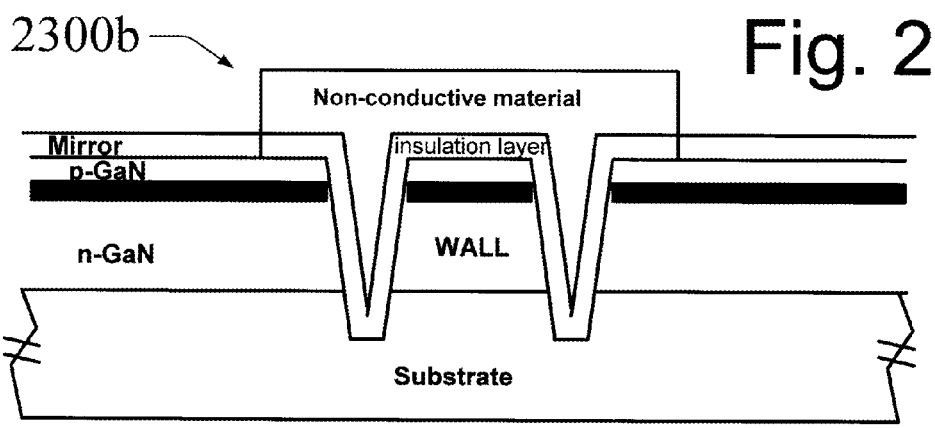
Figure 23C:
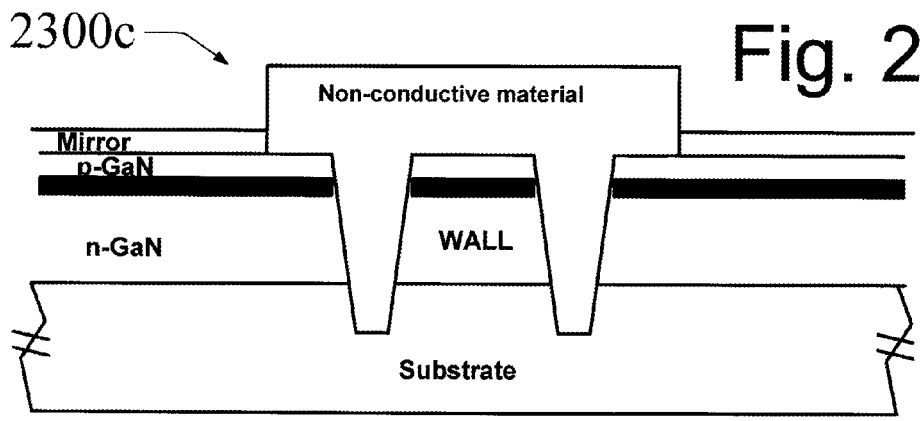
Figure 24A:
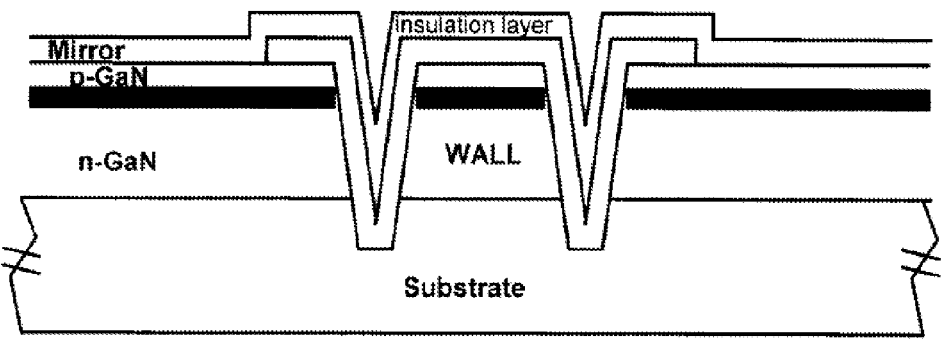
FIGS. 24a-c illustrate depositing a blanket mirror layer above the insulative layer or the non-conductive material in accordance with embodiments of the invention.
Figure 24B:
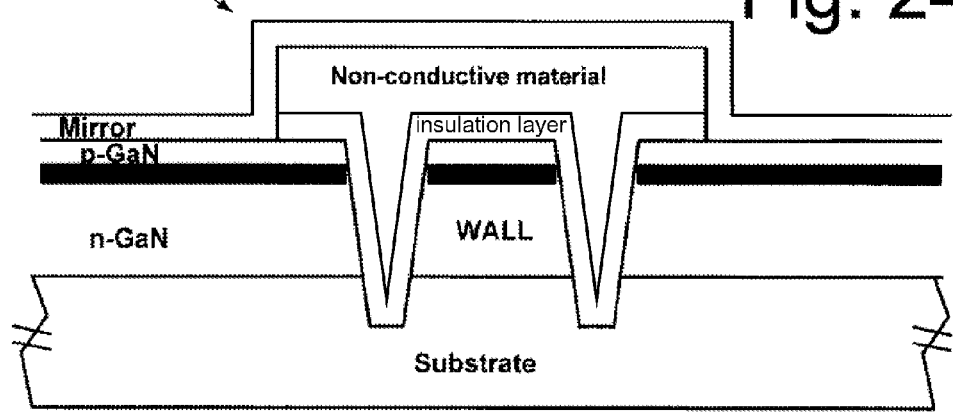
Figure 24C:
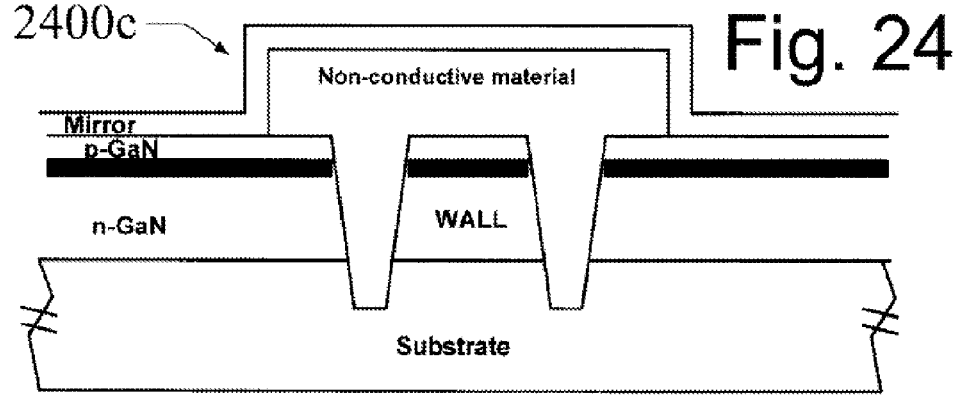

One or more electrically insulative layers, which may also be thermally conductive layers, (hereinafter referred to as the "insulation layer"), may be formed on top of the junction to protect the junction, after which portions of the insulation layer may be removed from unwanted areas. For some embodiments, as shown in FIGS. 6b and 23a-b, the mirror and the insulation layer may be defined by (i) depositing the insulation layer; (ii) forming a masking layer; (iii) using a wet or dry etch to remove a portion of the insulation layer that is on top of the p-GaN layer; (iv) depositing the mirror; and (v) then lifting off the masking layer so as to leave the mirror on top of the exposed p-GaN. Alternatively, the masking layer may be removed after a wet or dry etch process, and then a blanket mirror layer may be deposited either with or without removing the mirror from the insulation layer as in FIGS. 24a-c.

Figure 7A:
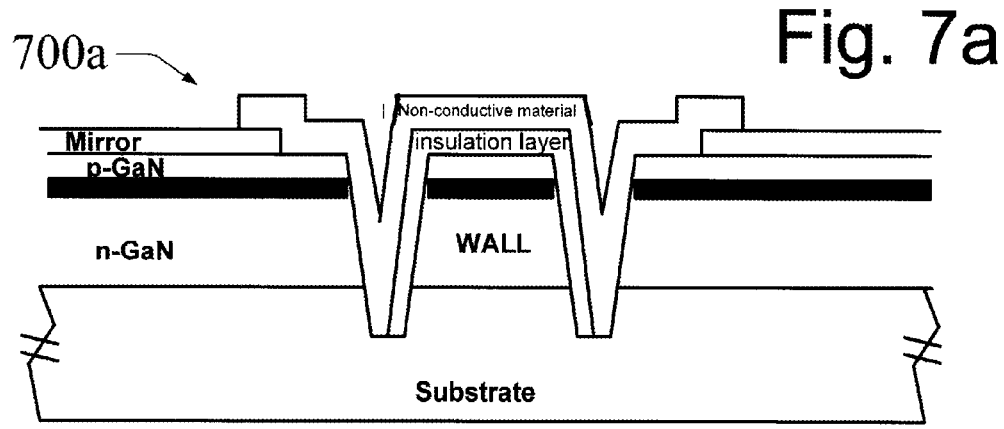
FIGS. 7a-c illustrate options for the non-conductive material and the insulative layer in accordance with embodiments of the invention.
Figure 7B:
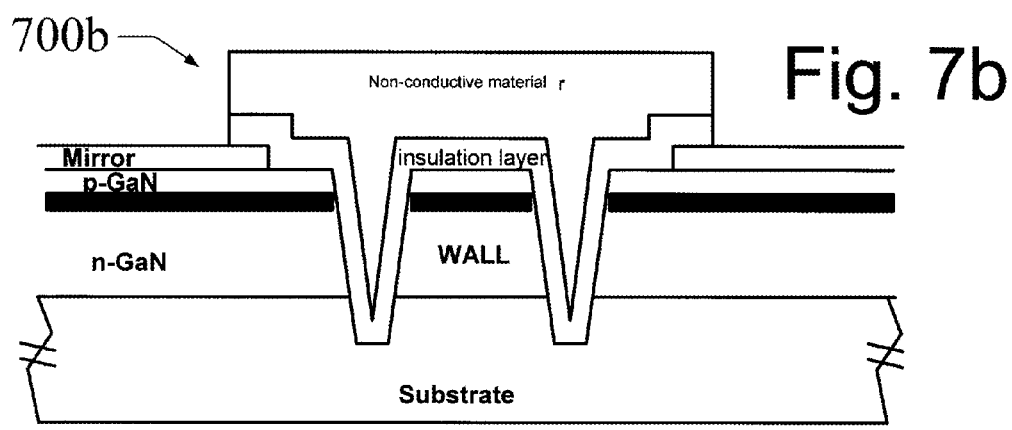

One or more electrically non-conductive layers, which may also be thermally conductive layers, (hereinafter referred to as the "non-conductive material") may be used to fill the street, the area between the defined devices. The filling of the streets with the non-conductive material may advantageously reduce, absorb, or perhaps stop the interaction of a potentially destructive force (e.g., ultraviolet (UV) light absorption or a laser induced shock wave) that might otherwise damage electrical devices during the separation of the epitaxial wafer assembly. By way of example, the non-conductive material that is used to fill the streets may be an organic material, such as an epoxy, a polymer, a polyimide, thermoplastic, and sol-gel. A photo sensitive organic material, such as SU-8, NR-7, AZ5214E may also be employed so that one does not have to define the material using a mask. The non-conductive material may also comprise inorganic materials such as SiO2, ZnO, Ta2O5, TiO2, HfO, or MgO. The non-conductive material that fills in the street will also cover the p-GaN as a layer that will further protect the active area, if the insulation layer does not remain over the active area (See FIGS. 7a-c). The non-conducting material may be either above or co-planar with the mirror, which may be multiple layers.

Figure 7C:
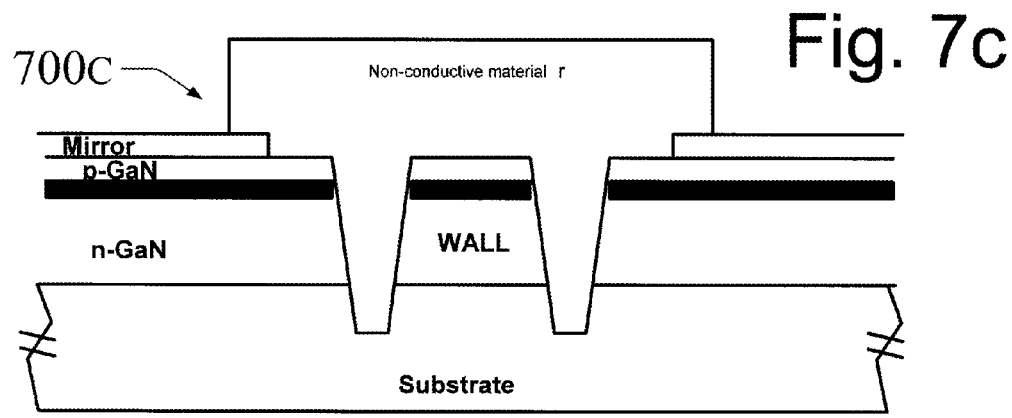

For some embodiments, the insulation layer may be used alone or in conjunction with the non-conductive material. Alternatively, the non-conductive material may be used by itself as seen in FIG. 7c where the insulation layer is not present.

A deposition of one or more metal layers may be made on top of the mirror and the non-conductive material in an effort to create one thick metal plate, for instance, as seen as "metal" in FIG. 9b. The one or more deposited metal layers may be formed by electrochemical deposition (ECD) or electroless chemical deposition (ElessCD). Before depositing the metal layer(s) using electrochemical or electroless chemical deposition techniques, a seed metal that is preferably electrically conductive may be formed as seen in FIG. 9a. The seed metal may be composed of copper, nickel, or tungsten that may be deposited as one or more layers by first using evaporation, sputtering, chemical vapor deposition (CVD), or metal organic chemical vapor deposition (MOCVD) of the tungsten before using ECD to form the copper and the nickel. The depositing of the metal layer may include CVD, plasma enhanced chemical vapor deposition (PECVD), physical vapor deposition (PVD), evaporation, or plasma spray. One or more additional metal layers may be formed above the original metal layer in an effort to protect the underlying metal layers. The metal layer may be single or multi-layered. In cases where the metal layer is a multi-layered structure, a plurality of metal layers with different composition (e.g., copper, nickel, gold, silver, and other metals and their alloys) may be formed, where these layers may be formed using different techniques. For some embodiments, the thickest metal layer may be deposited using ECD or ElessCD, where the thickest metal layer can be any layer within the multiple layers of metal.

Figure 8:
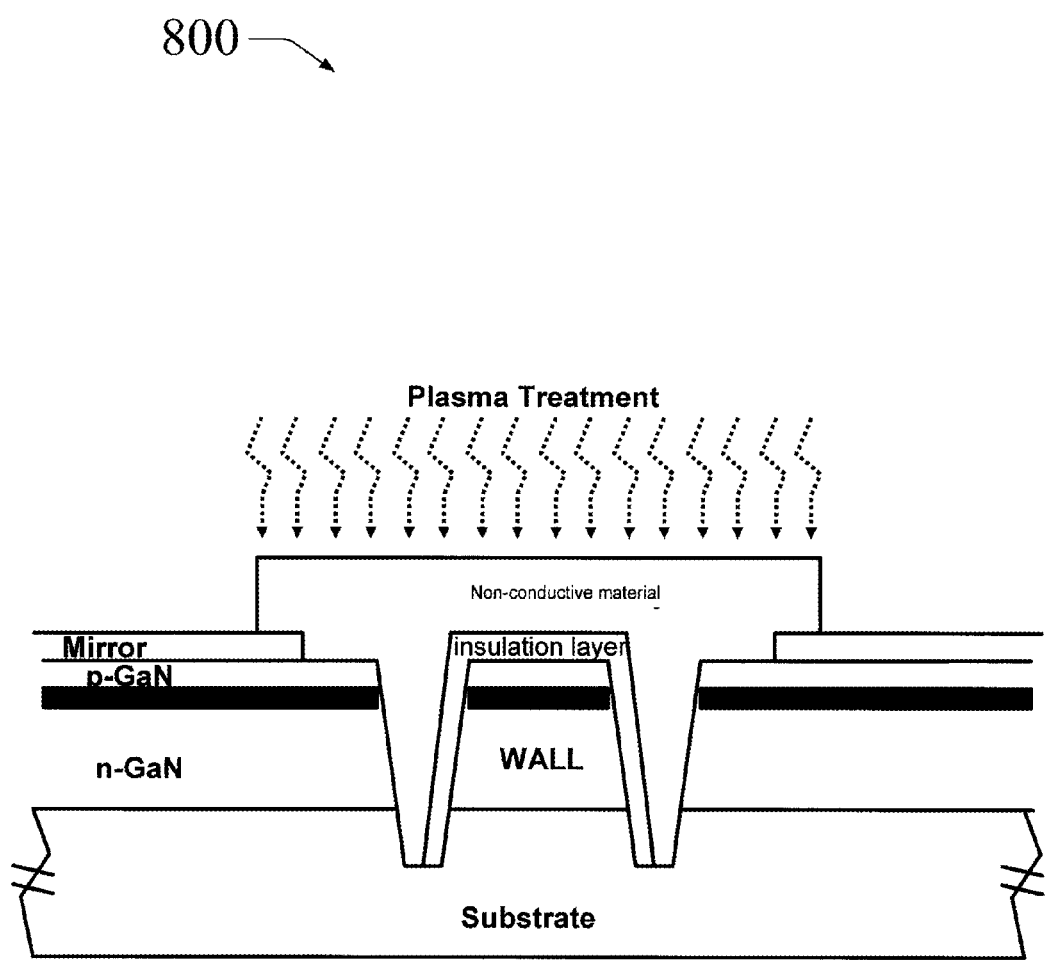
FIG. 8 illustrates surface treating the non-conductive material in accordance with an embodiment of the invention.

As shown for the wafer assembly 800 in FIG. 8, if there is a need to improve adhesion of the metal layer contacting the non-conducting materials, a surface treatment such as a plasma treatment, of the coated photo- or non-photo sensitive material may be employed in an effort roughen the surface and change its surface properties for better adhesion of the metal layer.

Referring now to FIGS. 9a-9b, in the case of ECD or ElessCD for the metal layer, a deposit of conductive materials may be made so as to form a seed metal. The seed metal may assist the growth of a single metal layer or of multiple metal layers via electroplating or an electroless plating process. The seed metal, as seen in FIGS. 9a-9b, may have a structure such as Ta/Cu, Ta/TaN/Cu, TaN/Cu, Ti/TaN/Cu, Ta/TiN/Cu, Ti/Cu, Ti/TiN/Cu, TiN/Cu, Cr/Au, Cr/Au/Ni/Au, Cr/Au/Ti/Ni/Au, Ti/Au, or Ti/Ni/Au. The mirror may be formed as a blanket layer which may also act as a seed layer, for example, as shown in FIG. 9b. In this case, the mirror may have a structure such as Ag/Ti/Au, Ag/TiN/Cu, Ag/Ta/Au, Ag/W/Au, Ag/TaN/Cu, Al/Ta/Au, or Al/TaN/Cu.

As shown wafer assembly 1000a in FIG. 10a, electro- or electroless plating may be used to grow the metal to a desired final thickness. The plated metal may be a single layer or multiple layers comprising metal or metal alloy, such as Cu, Ni, Ag, Au, Co, Cu—Co, Cu—Mo, Ni/Cu, or Ni/Cu—Mo. The thickness of each metal layer may be about 10-400 μm. The individual metal layers may have the same or different composition and may be deposited using various deposition techniques. One or more additional metal layers comprising, for example, Cr/Au, Ni, or Ni/Au, may be formed above the original metal layer(s) in an effort to protect the underlying metal.

Figure 10B:
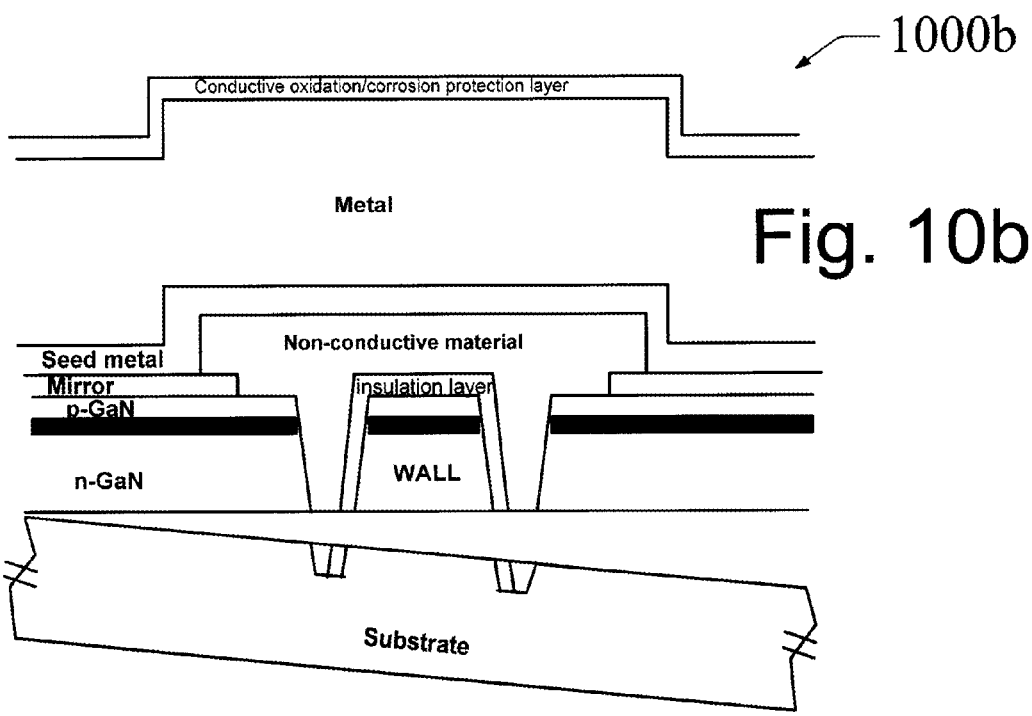

Using various techniques, preferably by a laser operation, the electrical devices fabricated on the epitaxial wafer assembly may be separated from the substrate, as shown in FIG. 10b and FIG. 18a. This separation may be accomplished by various processes, such as pulse laser irradiation, selected photo enhancement chemical etching of the interfacial layer between the substrate and the GaN, wet etching of the substrate, or lapping/polishing with chemical mechanical polishing.

For some embodiments, the electrical devices fabricated on the epitaxial wafer assembly may be separated from the substrate, as shown in FIG. 10b and FIG. 18a, using a pulse laser irradiation operation. Such devices may be fabricated in an effort to prevent damage (e.g., cracking) to GaN devices during the separation. Pulse laser irradiation may be used to decompose the interfacial layer of GaN on the substrate and/or remove the electrical devices from the substrate, although the electrical devices may still be held in place where the epitaxial wafer assembly has not been completely removed from the substrate. The laser beam of a pulse laser irradiation, as seen in FIG. 10a, may be larger than the device size such that there is an overlap of two laser beam pulses, where the overlap is focused on the middle of the street.

The separation of the GaN using pulse laser irradiation may result in its decomposition into Ga and N2, where the ablation of GaN only takes a few nanoseconds in an effort to avoid an explosion with N2 plasma. The light absorption and shock wave generated by the pulse laser irradiation from two laser beams may overlap the street region. As seen in FIG. 10a, the shaded region which is meant to represent a laser pulse may partially overlap the substrate, such that the laser operation extends all the way into the street. Overlapping in the streets may also be seen in FIG. 11 in the top view of an epitaxial wafer assembly.

For some embodiments, the one or more wall structures and/or the non-conductive material may advantageously reduce, absorb, or stop an interaction of a force (e.g., UV light absorption or a laser induced shock wave) that would otherwise potentially damage adjacent electrical devices during the separation of the devices from the substrate as described herein in relation to FIGS. 2a-b and 4a-b.

Figure 12:
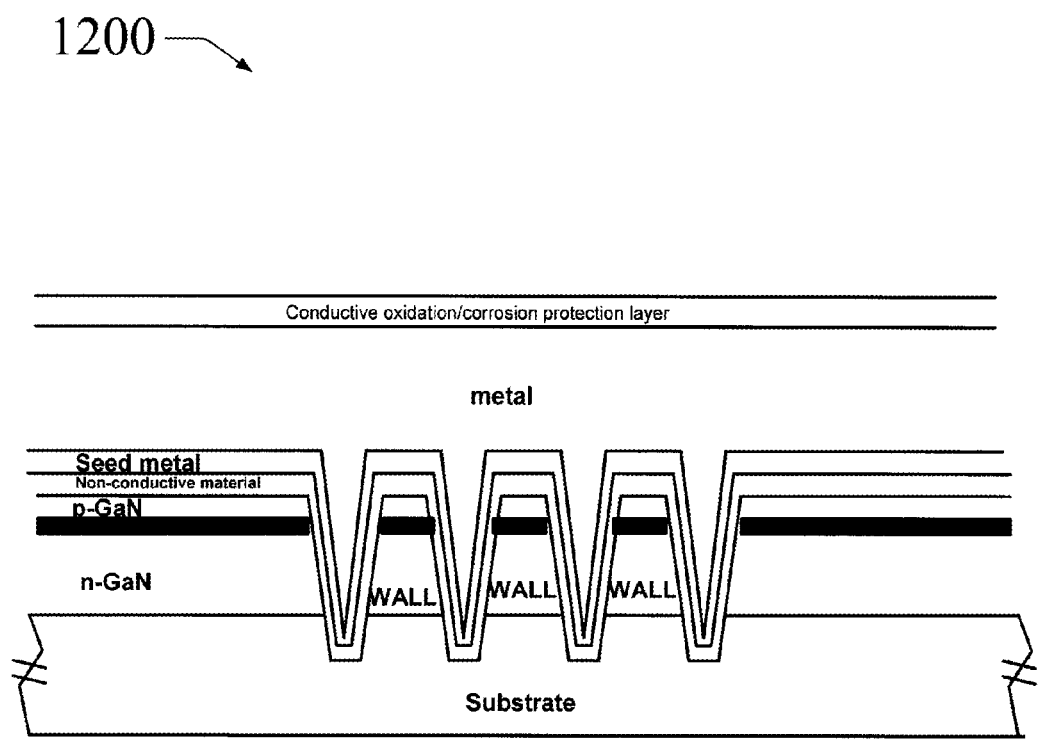
FIG. 12 illustrates filling in portions of the trenches with metal in accordance with an embodiment of the invention.
Figure 13:
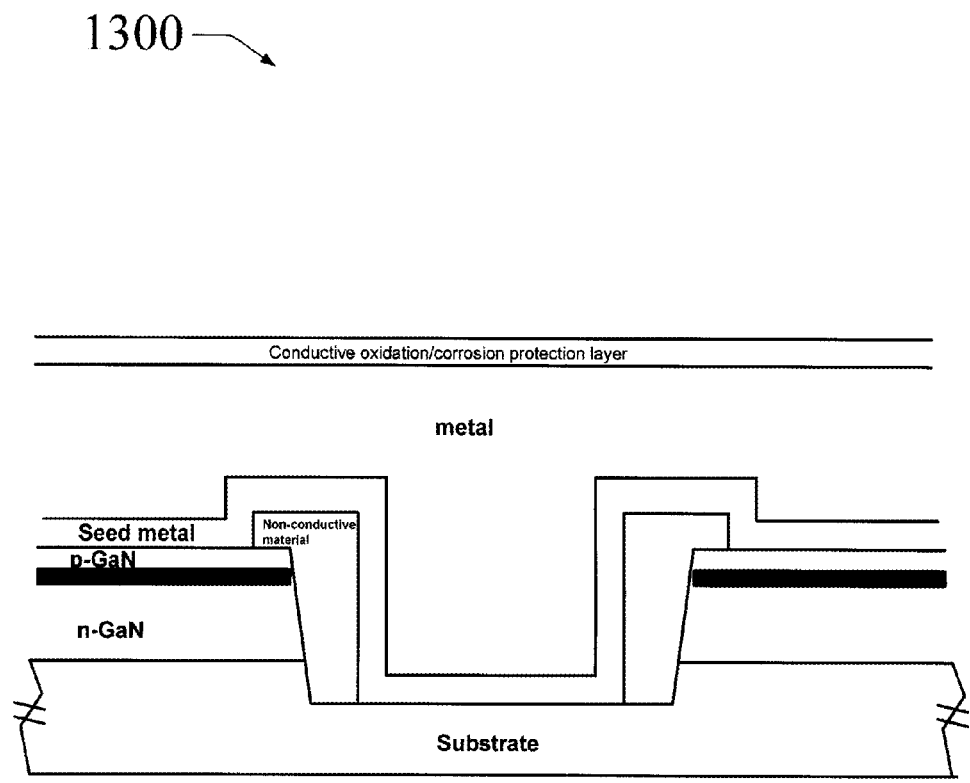
FIG. 13 illustrates filling in portions of a mesa with metal in accordance with an embodiment of the invention.

Referring now to FIGS. 12-13, for some embodiments, the streets with or without multiple GaN walls may be filled in with metal. Metals, and particularly, soft metals, such as Cr/Au/Cu, Ag/Ti/Cu, and the like, may absorb the shock wave that is propagated during the substrate removal operation, as well as the reflected UV light. The non-conductive material, which in some embodiments may simply make contact with the substrate rather than penetrate the substrate as shown in FIG. 13, may be chosen as photo-sensitive or non-photo-sensitive material (e.g., polymer, polyimide, SU-8, NR-7, AZ5214E, thermoplastic, ZnO, Ta2O5, TiO2, HfO, or MgO).

Figure 14:
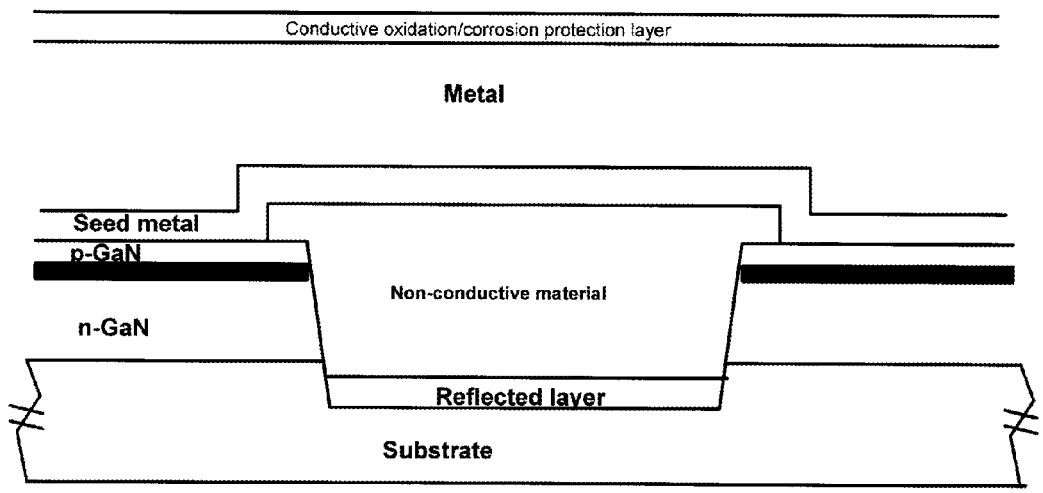
FIG. 14 illustrates forming reflective metal as a hard mask in the street area between dies in accordance with an embodiment of the invention.
Figure 15:
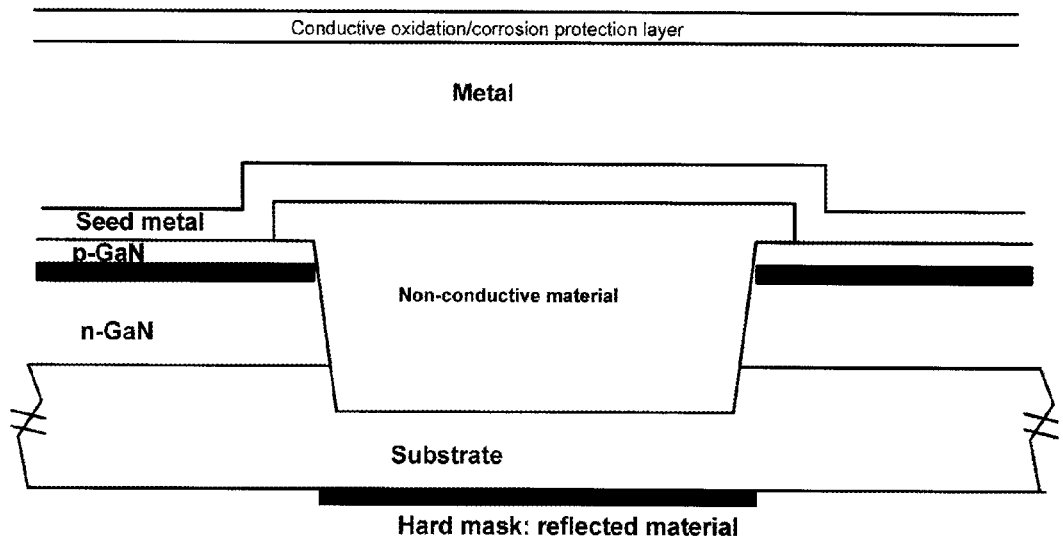
FIG. 15 illustrates forming reflective metal as a hard mask on the backside of the carrier substrate between dies in accordance with an embodiment of the invention.

For some embodiments, a reflective metal (e.g., Cr, Ag, Al . . . ) or a UV reflected material (e.g., ZnO, TiO2, etc.) may be formed as a hard mask on the street as seen in FIG. 14 or on the backside of the substrate as seen in FIG. 15. Such reflective material may prevent, stop, or reduce the (UV) laser light transmission. The non-conductive material may be chosen as a photo-sensitive or non-photo-sensitive material (e.g., polymer, polyimide, SU-8, NR-7, AZ5214E, thermoplastic, ZnO, Ta2O5, TiO2, HfO, MgO).

After removal of the epitaxial wafer assembly from the substrate, a metal n-pad (electrode) may be fabricated on each device on the epitaxial wafer assembly. The metal n-pad may comprise Ni/Au, Cr/Au, Ti/Au, Ti/Al, or Ti/TiN/Al/Au. Then, the exposed n-GaN surface may be processed further in an effort to enhance light output by increasing the surface area of the n-GaN through a process such as patterning, thinning, a wet or dry etch, or by texturing. One example of such a process is exposing the n-GaN surface to hot chemical solutions containing KOH and/or H3PO4. The roughened with increased n-GaN surface area may be seen in FIGS. 10b, 16a-16b, or 18a-18b. These figures provide examples of an n-GaN-up vertical light diode emitting (VLED) structure, where the light passes through the n-GaN to the environment outside the VLED structure.

GaN remaining on the street may be removed by a process such as wet chemical etching. Additionally, agitation with or without an ultrasonic/megasonic force and/or a tape lift-off process may also be employed. After the insulation layer has been removed, prior to which the epitaxial wafer assembly was removed from the substrate and an n-GaN surface patterning may have been performed as described herein, the GaN that remains on the street may be removed by the use of wet etching with or without using tape to assist the lift-off for structures as those shown in FIGS. 16a-16b, where such structures are upside down with respect to FIG. 15. In FIG. 16b, the insulation layer has been removed, though it had been previously formed, so that the wall may be more easily removed.

Figure 11:
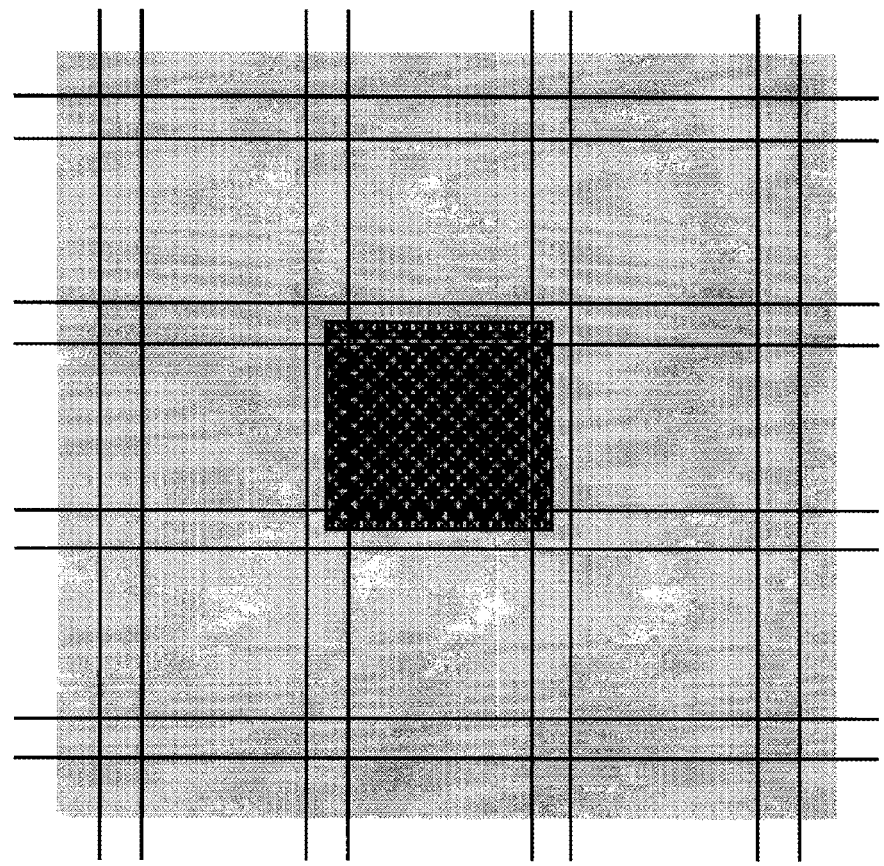
FIG. 11 illustrates the coverage area of a laser pulse applied to the wafer assembly as in FIG. 10a where the laser pulse covers the die and portions of the street areas in accordance with an embodiment of the invention.
Figure 17B:
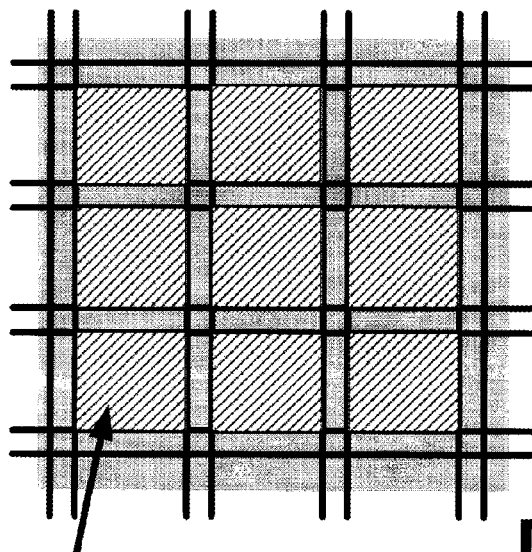

FIGS. 17a, 18a, and 18b represent an alternative implementation to that seen in FIGS. 10a-10b and 16a-16b. FIGS. 17a-17b show a laser interaction region that only covers the devices without extending into the streets, whereas FIGS. 10a and 11 show a laser interaction region that extends into the streets. The shaded regions of the substrate in FIGS. 10a and 17a, and the laser interaction regions in FIGS. 11 and 17b, respectively, may indicate operations by a pulsed laser. The smaller laser interaction region shown in FIG. 17b may be advantageous in that only the electrical device itself, rather than the street regions, is operated upon by the pulse laser.

Therefore the GaN on the street should still be attached to the substrate and may then be removed together with the substrate after laser processing where the epitaxial wafer assembly is removed from the substrate.

Comparing FIGS. 16a-16b with FIGS. 18a-18b, FIG. 18b shows that the wall has been removed, whereas FIG. 16a shows that the fabrication process has not removed the wall from the wafer assembly. The removal of the wall as depicted in FIG. 18a may be accomplished by limiting the exposure of the wafer to the pulse laser as seen in FIG. 17b. As such, when electrical devices are separated from the substrate, the one or more walls may also be removed as seen in FIGS. 18a-18b. FIG. 16a depicts the wall still attached to the wafer assembly after substrate removal and the removal of the wall in FIG. 16b. In contrast, FIGS. 18a-18b show that the wall may be removed together with the substrate after the separation step. Accordingly, it may be desirable, in the embodiments shown in FIGS. 17a-18b, that the beam of the pulse laser operate on the devices but not within the streets through the non-conductive material, as compared to the implementation depicted in FIGS. 10a-10b, 11, and 16a-16b where both the devices and the streets were exposed to the beam of the pulse laser prior to the epitaxial wafer assembly being separated from the substrate.

After separating the substrate from the epitaxial wafer assembly, the wafer may be diced (i.e., dicing into individual semiconductor dies) using various steps. In these steps, methods to separate the dies include using a breaker, an air knife, or a water jet with a chemical solution (for coating the anti-oxidizing material on the cut edge of copper).

Figure 19A:
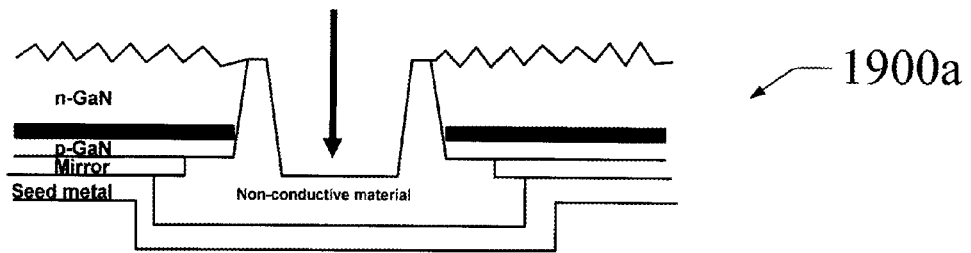
FIGS. 19a-c illustrate dicing the wafer assembly into individual semiconductor dies in accordance with embodiments of the invention.
Figure 19B:
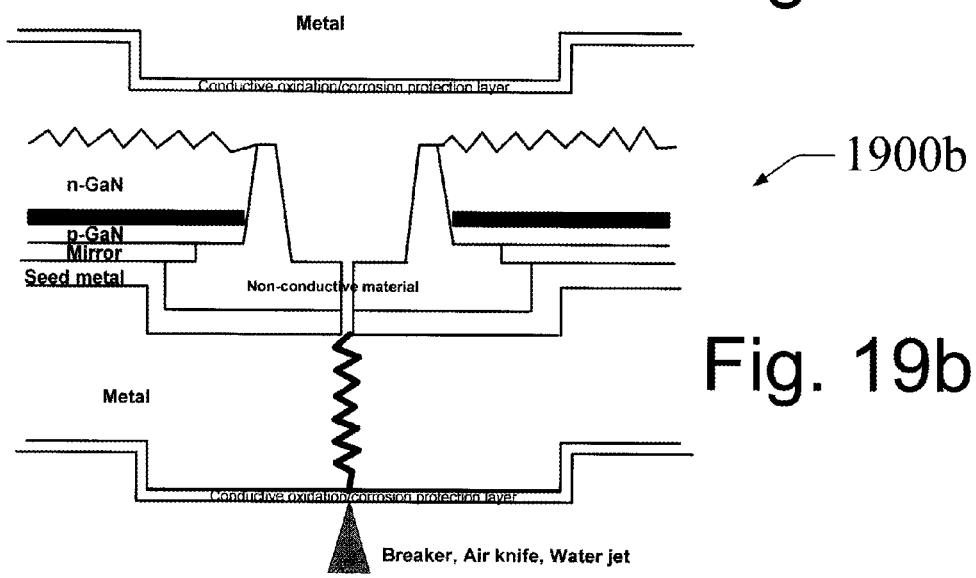
Figure 19C:
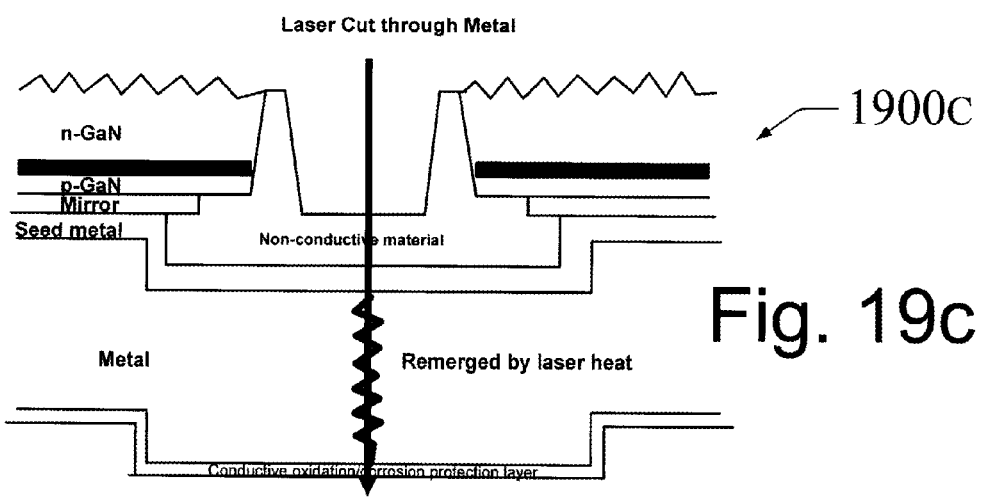

For some embodiments, a wafer assembly having dies disposed thereon may be separated by laser cut, saw cut, or water jet processes. This is represented by a downward force seen in wafer assembly 1900a in FIG. 19a. After a laser has been used to cut the metal substrate, the metal may remerge together from the laser heating, as seen in wafer assembly 1900b in FIG. 19b. Then, the dies may be fully separated by the application of a light force such as by using a breaker, a knife, an air knife, or a water jet, as shown regarding wafer assembly 1900c in FIG. 19c.

Figure 20A:
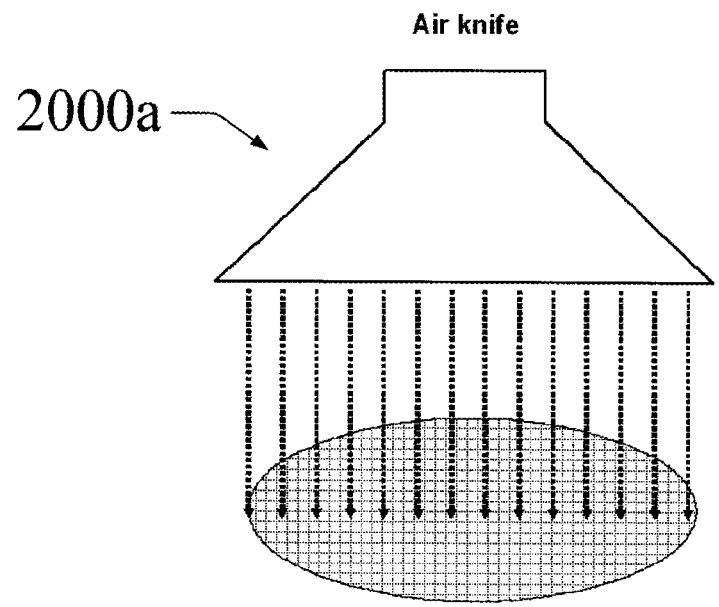
FIGS. 20a-b illustrate dicing the wafer assembly with an air knife or a water jet with a chemical solution in accordance with embodiments of the invention.

In that the force of the breaker may be too strong and cause damage to the electrical devices, the dies may be separated by using an air knife to carefully control the dicing of the wafer, as shown regarding wafer assembly 2000a in FIG. 20a.

Figure 20B:
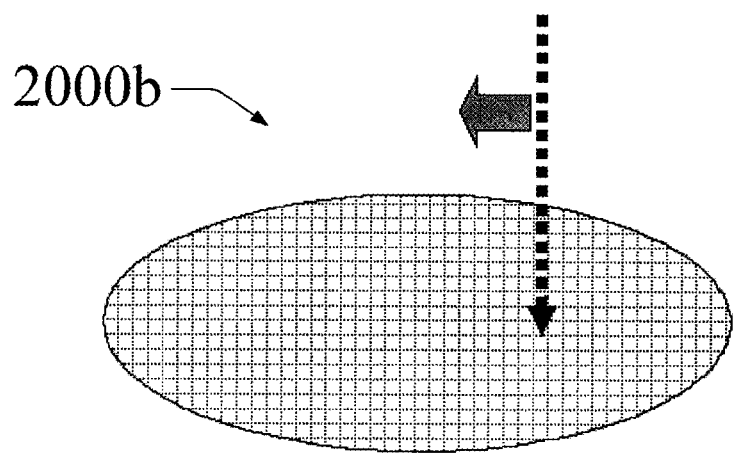

For the dicing, especially after a laser cutting operation, an anti-oxidizing passivation may be applied to the edges of the dies, such as by the use of a chemical water jet solution, as shown in FIG. 20b wherein the chemical solution may be, for example, a Pd, Ni, or Au plating solution.

FIG. 21 depicts a process 2100 that is an exemplary implementation for fabricating a VLED. Note that the process 2100 is only an example of one implementation of such a process, that the steps seen in process 2100 may be re-arranged, and that some of the steps may be optional. Process 2100 includes a step 2102 of providing a sapphire substrate and forming an epitaxial structure over the sapphire substrate, where the epitaxial structure may comprise n-GaN/MQW/p-AlGaN/GaN. At an optional step 2104, a mesa may be defined. The mesa may be defined through a junction and into the sapphire substrate, which may include single or multiple wall barriers. Optionally, at step 2106, a mirror may be formed on top of the p-GaN. At step 2108, one or more walls in the streets may be covered with an insulation layer. As a further option, steps 2106 and 2108 can be reversed. At step 2110, portions of the insulation layer from a street may be selectively removed, the street may be filled with a non-conductive material in step 2112, and the non-conductive material may be selectively removed in step 2113. An optional deposit of a seed metal layer may be made at step 2114, followed in step 2116 by the growing of one or more metal layers to a desired thickness. In step 2118, the epitaxial structure may be separated from the sapphire substrate. N-pads may be fabricated on each VLED device in step 2120, and in optional step 2122, the GaN that is in the street may be removed. As a further option, in step 2124, material may be selectively removed from the street, and a dicing operation may take place in step 2126. The dicing operation may use any of the dicing techniques disclosed herein or otherwise known in the art. After each die has been separated, packaging and assembly of each die may be performed.

Figure 22:
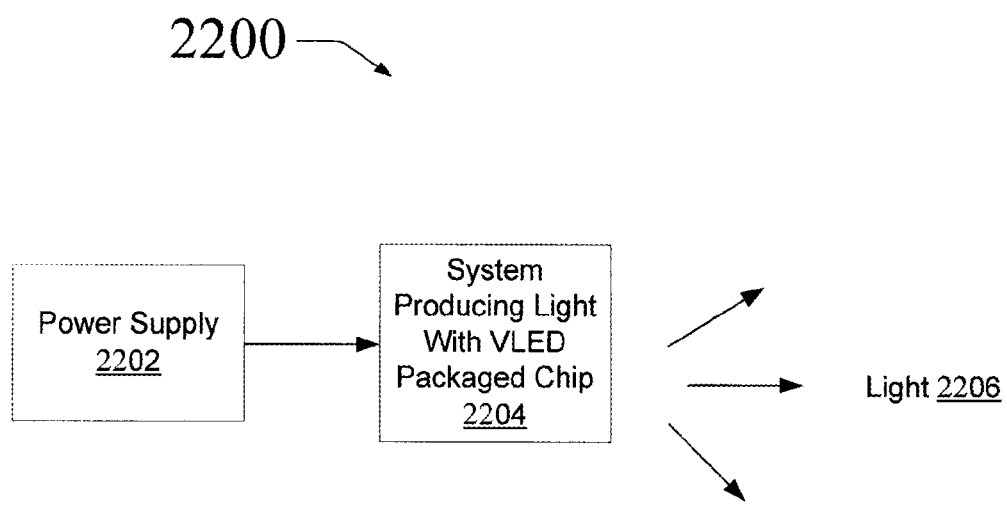
FIG. 22 is a block diagram of a light producing system employing VLED devices produced in FIG. 21 in accordance with an embodiment of the invention.

Packaged and assembled die may be incorporated into a light producing system, such as that depicted in FIG. 22. A light 2206 may be produced by one or more VLEDs using power supplied by power supply 2202. The one or more VLEDs may each be fabricated as illustrated and described with respect to FIGS. 1-21. By way of example and not by way of limitation, a system producing light with packaged VLED die 2204 may be a flash light, a headlamp, a light that functions as a suitable replacement for a convention light bulb, and the like.

Embodiments disclosed herein may also be applied to the fabrication of GaN-based electronic devices such as power devices, laser diodes, and vertical cavity surface emitting laser device due to its high heat dissipation rate of its metal substrate. Relative to LEDs, the above teaching can improve yield, brightness, and thermal conductivity.

While the foregoing is directed to embodiments of the present invention, other and further embodiments of the invention may be devised without departing from the basic scope thereof, and the scope thereof is determined by the claims that follow.

What is claimed is:

1. A method comprising:
    providing a wafer assembly comprising a substrate having a device side and an opposing back side, and a plurality of semiconductor layers on the device side of the substrate;
    applying a laser to cut through the semiconductor layers and into the device side of the substrate, without cutting completely through the substrate to form a plurality of substrate trenches and walls, and to define a plurality of semiconductor devices on the substrate, with the substrate trenches and the walls configured such that at least two substrate trenches and at least one wall are formed between each adjacent semiconductor device; and
    removing the substrate from the semiconductor layers after the applying the laser step by laser irradiation of the back side of the substrate with a laser energy, with the walls reducing the laser energy on the semiconductor devices and preventing damage during the laser irradiation.

2. The method of claim 1 wherein the applying the laser step forms a plurality of walls between each adjacent semiconductor device.

3. The method of claim 1 wherein the applying the laser step forms two substrate trenches and one wall between each adjacent semiconductor device.

4. The method of claim 1 wherein the substrate trenches have a depth of from 0.001 μm to 300 μm.

5. The method of claim 1 wherein the applying the laser step forms four substrate trenches and three walls between each adjacent semiconductor device.

6. The method of claim 1 wherein the applying the laser step forms the substrate trenches with a width of 0.1 μm to 300 μm.

7. The method of claim 1 wherein the laser has a wavelength of 266 nm or 355 nm.

8. The method of claim 1 wherein the semiconductor layers comprise an n-doped layer on the substrate and a p-doped layer on the n-doped layer and a width of a substrate trench at the p-doped layer is wider than a width of the substrate trench at the n-doped layer.

9. The method of claim 1 further comprising using wet etching or dry etching after the applying the laser step to further define the semiconductor devices.

10. The method of claim 1 further comprising using wet etching or dry etching before the applying the laser step.

11. The method of claim 1 wherein the applying the laser step is performed using an oxygen-containing environment.

12. The method of claim 1 further comprising applying a protective coating to a surface of the wafer assembly before the applying the laser step.

13. The method of claim 12 wherein the protective coating comprises a polymer.

14. The method of claim 12 further comprising:
removing the protective coating after the applying the laser step; and
cleaning the semiconductor devices.

15. The method of claim 1 further comprising cleaning the semiconductor devices in a liquid.

16. The method of claim 15 wherein the liquid comprises an acid or a base with or without an oxidizer.

17. The method of claim 15 wherein the liquid comprises H2SO4:H2O2, HNO3, HNO3:HCl, NH4OH:H2O2, KOH:H2O2, or H3PO4.

18. A method comprising:
providing a wafer assembly comprising a substrate having a device side and an opposing back side, an n-doped layer on the device side of the substrate, a multiple quantum well (MQW) layer on the n-doped layer, and a p-doped layer on the (MQW) layer;
cutting through the p-doped layer, the (MQW) layer, and the n-doped layers and into the device side of the substrate with a laser without cutting completely through the substrate to form a plurality of substrate trenches and walls, and define a plurality of vertical light-emitting diode (VLED) devices on the substrate, with the substrate trenches and the walls configured such that at least two substrate trenches and at least one wall are formed between each adjacent (VLED) device; and
removing the substrate from the semiconductor layers after the cutting step by laser irradiation of the back side of the substrate with a laser energy, with the walls reducing the laser energy on the (VLED) devices and preventing damage during the laser irradiation.

19. The method of claim 18 wherein the cutting step forms a plurality of walls between each adjacent (VLED) device.

20. The method of claim 18 wherein the cutting step forms four substrate trenches and three walls between each adjacent (VLED) device.

21. The method of claim 18 wherein a width of the substrate trenches at the p-doped layer is wider than the width of the substrate trenches at the n-doped layer.

22. The method of claim 18 further comprising applying a protective coating to a surface of the wafer assembly before the cutting step.

23. The method of claim 22 further comprising:
removing the protective coating after the cutting step; and
cleaning the (VLED) devices.

24. The method of claim 18 further comprising cleaning the (VLED) devices using a solution.

\* \* \* \* \*